US008609181B2

(12) United States Patent
Yamazaki et al.

(10) Patent No.: US 8,609,181 B2
(45) Date of Patent: Dec. 17, 2013

(54) LIGHT EMITTING DEVICE AND METHOD FOR FABRICATING LIGHT EMITTING DEVICE

(75) Inventors: Shunpei Yamazaki, Tokyo (JP); Ritsuko Nagao, Kanagawa-ken (JP); Yasuo Nakamura, Kanagawa-ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 384 days.

(21) Appl. No.: 12/507,820

(22) Filed: Jul. 23, 2009

(65) Prior Publication Data

US 2009/0286445 A1   Nov. 19, 2009

Related U.S. Application Data

(62) Division of application No. 11/745,541, filed on May 8, 2007, now Pat. No. 7,579,774, and a division of application No. 10/867,581, filed on Jun. 15, 2004, now Pat. No. 7,221,095.

(30) Foreign Application Priority Data

Jun. 16, 2003  (JP) .................................. 2003-171366
Jun. 27, 2003  (JP) .................................. 2003-183796

(51) Int. Cl.
*B05D 5/06*   (2006.01)
(52) U.S. Cl.
USPC .................................. 427/66; 427/69; 427/70
(58) Field of Classification Search
USPC .......................... 427/66, 69, 70; 313/504–509
See application file for complete search history.

(56) References Cited

U.S. PATENT DOCUMENTS 4,786,358 A   11/1988   Yamazaki
5,163,220 A   11/1992   Zeto
(Continued)

FOREIGN PATENT DOCUMENTS

EP   0 399 299 A2   11/1990
EP   0 567 835 A1   11/1993
(Continued)

OTHER PUBLICATIONS

M.A. Baldo et al.; "Highly Efficient Phosphorescent Emission From Organic Electroluminescent Devices"; *Letters to Nature*, vol. 395; pp. 151-154; Sep. 10, 1998.

(Continued)

*Primary Examiner* — James Lin
(74) *Attorney, Agent, or Firm* — Fish & Richardson P.C.

(57) ABSTRACT

It is an object of the present invention to provide a method for fabricating a light emitting device, in which brightness gradient due to potential drop of a counter electrode can be prevented from being observed and an auxiliary electrode can be formed without increasing the number of steps, even when the precision of a light emitting device is improved. It is another object of the invention to provide a light emitting device fabricated according to the method. The light emitting device has a light emitting element and an auxiliary electrode in each pixel. The light emitting element includes a first electrode, a second electrode, an electroluminescent layer provided between the first and the second electrodes. Further, the first electrode is overlapped with the electroluminescent layer and the second electrode formed over an insulating film by means of a first opening formed in the insulating film. Still further, the auxiliary electrode is overlapped with the second electrode by means of a second opening formed over the second insulating film.

16 Claims, 26 Drawing Sheets

(56) References Cited

U.S. PATENT DOCUMENTS

| | | |
|---|---|---|
| 5,198,153 A | 3/1993 | Angelopoulos et al. |
| 5,200,112 A | 4/1993 | Angelopoulos et al. |
| 5,202,061 A | 4/1993 | Angelopoulos et al. |
| 5,227,252 A | 7/1993 | Murayama |
| 5,368,783 A | 11/1994 | Kobayashi |
| 5,399,936 A | 3/1995 | Namiki |
| 5,400,047 A | 3/1995 | Beesely |
| 5,638,783 A | 6/1997 | Regueiro |
| 5,643,826 A | 7/1997 | Ohtani |
| 5,652,067 A | 7/1997 | Ito |
| 5,661,500 A | 8/1997 | Shinoda |
| 5,721,299 A | 2/1998 | Angelopoulos et al. |
| 5,923,962 A | 7/1999 | Ohtani |
| 5,932,327 A | 8/1999 | Inoguchi |
| 6,008,588 A | 12/1999 | Fujii |
| 6,013,384 A | 1/2000 | Kido et al. |
| 6,023,073 A | 2/2000 | Strite |
| 6,037,712 A | 3/2000 | Codama |
| 6,049,228 A | 4/2000 | Moon |
| 6,084,579 A | 7/2000 | Hirano |
| 6,087,770 A | 7/2000 | Kaneko |
| 6,124,604 A | 9/2000 | Koyama |
| 6,140,766 A | 10/2000 | Okada |
| 6,281,520 B1 | 8/2001 | Yamazaki |
| 6,285,042 B1 | 9/2001 | Ohtani |
| 6,320,311 B2 | 11/2001 | Nakaya |
| 6,331,356 B1 | 12/2001 | Angelopoulos et al. |
| 6,335,541 B1 | 1/2002 | Ohtani |
| 6,359,606 B1 | 3/2002 | Yudasaka |
| 6,538,374 B2 | 3/2003 | Hosokawa |
| 6,593,691 B2 | 7/2003 | Nishi |
| 6,608,449 B2 | 8/2003 | Fukunaga |
| 6,630,687 B1 | 10/2003 | Koyama |
| 6,636,520 B1 | 10/2003 | Jason et al. |
| 6,746,770 B1 | 6/2004 | Afzali-Ardakani et al. |
| 6,781,162 B2 | 8/2004 | Yamazaki |
| 6,797,450 B2 | 9/2004 | Suzuki et al. |
| 6,828,725 B2 | 12/2004 | Kimura |
| 6,900,470 B2 | 5/2005 | Kobayashi et al. |
| 6,917,160 B2 | 7/2005 | Koo et al. |
| 6,933,672 B2 | 8/2005 | Hosokawa |
| 6,967,236 B1 | 11/2005 | Angelopoulos et al. |
| 7,008,883 B2 | 3/2006 | Kashiwagi et al. |
| 7,019,457 B2 | 3/2006 | Fukunaga |
| 7,034,455 B2 | 4/2006 | Koo et al. |
| 7,042,154 B2 | 5/2006 | Kobayashi |
| 7,095,474 B2 | 8/2006 | Angelopoulos et al. |
| 7,161,184 B2 | 1/2007 | Miyagi et al. |
| 7,173,373 B2 | 2/2007 | Yamada |
| 7,202,601 B2 | 4/2007 | Fukunaga |
| 7,224,115 B2 | 5/2007 | Sato et al. |
| 7,224,118 B2 | 5/2007 | Yamazaki et al. |
| 7,250,718 B2 | 7/2007 | Hosokawa |
| 7,507,609 B2 | 3/2009 | Koo et al. |
| 7,592,980 B2 | 9/2009 | Yamazaki et al. |
| 7,718,452 B2 | 5/2010 | Sato et al. |
| 2001/0024083 A1 | 9/2001 | Yamazaki |
| 2001/0025959 A1* | 10/2001 | Yamazaki et al. ............... 257/72 |
| 2001/0026714 A1* | 10/2001 | Uezono et al. ............... 399/264 |
| 2001/0043046 A1 | 11/2001 | Fukunaga |
| 2001/0055841 A1 | 12/2001 | Yamazaki et al. |
| 2002/0047568 A1 | 4/2002 | Koyama |
| 2002/0053670 A1 | 5/2002 | Ohtani |
| 2002/0068388 A1 | 6/2002 | Murakami et al. |
| 2002/0153844 A1 | 10/2002 | Koyama |
| 2002/0158835 A1 | 10/2002 | Kobayashi |
| 2002/0167026 A1 | 11/2002 | Azami |
| 2003/0094895 A1 | 5/2003 | Okuyama |
| 2004/0003939 A1 | 1/2004 | Nishi |
| 2004/0012550 A1 | 1/2004 | Koyama |
| 2004/0032202 A1 | 2/2004 | Fukunaga |
| 2004/0046164 A1 | 3/2004 | Kobayashi |
| 2004/0075092 A1 | 4/2004 | Arao |
| 2004/0084675 A1 | 5/2004 | Koyama |
| 2004/0119399 A1 | 6/2004 | Nagayama |
| 2004/0256620 A1 | 12/2004 | Yamazaki |
| 2005/0001546 A1 | 1/2005 | Yamaguchi |
| 2005/0012454 A1 | 1/2005 | Yamazaki |
| 2005/0051776 A1 | 3/2005 | Miyagi |
| 2005/0179374 A1 | 8/2005 | Kwak |
| 2006/0238116 A1 | 10/2006 | Angelopoulos et al. |
| 2006/0238690 A1 | 10/2006 | Angelopoulos et al. |
| 2007/0057624 A1 | 3/2007 | Angelopoulos et al. |
| 2007/0110921 A1 | 5/2007 | Angelopoulos et al. |
| 2007/0205718 A1 | 9/2007 | Yamazaki et al. |
| 2007/0247064 A1 | 10/2007 | Hosokawa |

FOREIGN PATENT DOCUMENTS

| | | |
|---|---|---|
| EP | 0 855 848 A2 | 7/1998 |
| EP | 1 045 451 | 10/2000 |
| EP | 1063630 A2 | 12/2000 |
| EP | 1 191 820 A1 | 3/2002 |
| EP | 1 312 982 A1 | 5/2003 |
| EP | 1 321 821 A1 | 6/2003 |
| EP | 1 369 924 A2 | 12/2003 |
| EP | 1 369 942 A2 | 12/2003 |
| JP | 06-013184 A | 1/1994 |
| JP | 07-130652 | 5/1995 |
| JP | 10-270171 A | 10/1998 |
| JP | 2000-505249 A | 4/2000 |
| JP | 2001-183996 A | 7/2001 |
| JP | 2001-230086 A | 8/2001 |
| JP | 2002-022932 A | 1/2002 |
| JP | 2002-033198 | 1/2002 |
| JP | 2002-117985 A | 4/2002 |
| JP | 2002-169277 A | 6/2002 |
| JP | 2002-189290 A | 7/2002 |
| JP | 2002-229482 A | 8/2002 |
| JP | 2002-318556 A | 10/2002 |
| JP | 2003-086357 A | 3/2003 |
| JP | 2004-014366 A | 1/2004 |
| JP | 2004-071365 A | 3/2004 |
| JP | 2004-111369 A | 4/2004 |
| JP | 2004-207217 A | 7/2004 |
| JP | 2004-349097 A | 12/2004 |
| WO | 98/21755 A2 | 5/1998 |

OTHER PUBLICATIONS

M.A. Baldo et al.; "Very High-Efficiency Green Organic Light-Emitting Devices Based on Electrophosphorescence"; *Applied Physics Letters*, vol. 75, No. 1; pp. 4-6; Jul. 5, 1999.

Tetsuo Tsutsui et al.; "Electroluminescence in Organic Thin Films"; *Photochemical Processes in Organized Molecular Systems*; pp. 437-450; 1991.

Tetsuo Tsutsui et al.; "High Quantum Efficiency in Organic Light-Emitting Devices with Iridium-Complex as a Triplet Emissive Center"; *Japan Journal of Applied Physics*, vol. 38, Part 2, No. 12B; pp. L1502-L1504; Dec. 15, 1999.

* cited by examiner

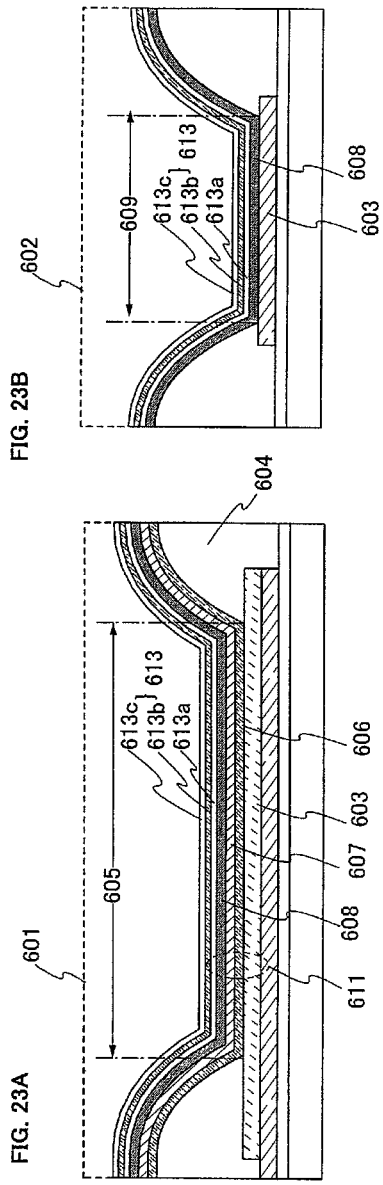

LIGHT EMITTING DEVICE AND METHOD FOR FABRICATING LIGHT EMITTING DEVICE

CROSS-REFERENCE TO RELATED APPLICATIONS

This application is a divisional of U.S. application Ser. No. 11/745,541, filed May 8, 2007, now U.S. Pat. No. 7,579,774, which is a divisional of U.S. application Ser. No. 10/867,581, filed Jun. 15, 2004, now U.S. Pat. No. 7,221,095, which claims the benefit of foreign priority applications filed in Japan as Serial No. 2003-171366 on Jun. 16, 2003 and Serial No. 2003-183796 on Jun. 27, 2003, all of which are incorporated by reference.

BACKGROUND OF THE INVENTION

1. Field of the Invention

The present invention relates to a light emitting device in which a light emitting element and an element for supplying current to the light emitting element are provided for each of a plurality of pixels and to a method for fabricating the light emitting device.

2. Description of the Related Art

A light emitting element has high visibility since it emits light by itself, and is most suitable for thinning since it does not need a backlight, which is required in a liquid crystal display device (LCD); further, there is no limitation of viewing angle either. Therefore, a light emitting device with the use of a light emitting element has been attracting attention as a display device which replaces a CRT and an LCD. In late years, a light emitting device has been put to practical use; for example, it is provided in a cellular phone or an electronic device such as a digital still camera.

A light emitting element has an anode, a cathode, and an electroluminescent layer sandwiched between the two electrodes. One of the two electrodes is referred to as a pixel electrode hereinafter In the pixel electrode, the potential is controlled corresponding to a video signal and a pixel electrode in a pixel is separated from pixel electrodes in other pixels. The other electrode in which a common potential is given (referred to as a counter electrode) is normally formed all over to be shared by all pixels, or formed so that pixels of each of RGB have a common counter electrode because it is not realistic to divide the counter electrode as the pixel electrode. Supply of potential to the counter electrode is performed via a connection terminal provided at an end portion of a panel. Specifically, the contact of the counter electrode with a wiring for leading (referred to as a leader wiring) is made, and the counter electrode and the connection terminal are electrically connected by the leader wiring. Then, the contact is provided in a region other than an area where the electroluminescent layer of a pixel area is formed.

As a screen is made larger, the area of the pixel area becomes larger, and potential drop due to the resistance of the counter electrode tends to be significant. Brightness gradient could be observed when viewed as a whole pixel area since the absolute value of voltage Vel applied between electrodes of a light emitting element is reduced in a pixel in which the potential drop of a counter electrode is significant. In order to avoid the above problem, a technology is proposed in Reference 1 (Reference 1: Japanese Patent Laid-Open No. 2002-033198). In the technology, an electrode for an auxiliary (an auxiliary electrode) is formed from a material with low resistance so that the auxiliary electrode is connected to a counter electrode, thereby uniforming the potential in the plane of the counter electrode after the formation of the light emitting element.

As mentioned above, in the cases where the resistivity of a material forming a counter electrode is high, or where the resistance of a counter electrode becomes high due to the increase in the area of a pixel area, it is a very effective measure to form an auxiliary electrode for uniforming the potential in the plane of the counter electrode. However, it is necessary to lay out the auxiliary electrode so as to obstruct as less light from a light emitting element as possible in the case of a type of a light emitting device (a top emission type) in which light emitted from an electroluminescent layer is released from a light transmitting counter electrode. However, even if an auxiliary electrode is formed only in an area which is not overlapped with a pixel area, it is difficult to obtain desirable effect of the uniform potential in the plane of the counter electrode. Therefore, an auxiliary electrode is formed over a counter electrode in the area where light emission is not actually obtained, such as an area between light emitting elements of adjacent pixels.

However, as the size of a pixel is reduced due to developments in higher precision of pixels as well as larger screens, the width between light emitting elements of adjacent pixels becomes less than 20 µm. Accordingly, an auxiliary electrode is required to fit within the above width, and it is becoming difficult to form an auxiliary electrode over a counter electrode by vapor deposition with the use of a metal mask which cannot form a very precise pattern. When an auxiliary electrode is formed over a counter electrode by photolithography, the pattern can be formed with precision of µm or less. However, it is unfavorable since degradation of a light emitting element due to light or moisture might be accelerated in serial steps including exposure, development, and removal of a photoresist. Further, although an auxiliary electrode can be formed by a printing method typified by ink-jet printing, it is undesirable since the number of steps for forming the auxiliary electrode would increase. This problem is the same in vapor deposition and lithography.

SUMMARY OF THE INVENTION

In view of the above problem, it is an object of the present invention to provide a method for fabricating a light emitting device, in which brightness gradient due to potential drop of a counter electrode can be prevented from being observed and an auxiliary electrode can be formed without increasing the number of steps, even when the precision of a light emitting device is improved. It is another object of the invention to provide a light emitting device fabricated according to the method.

According to the invention, an auxiliary electrode is formed before the formation of an electroluminescent layer of a light emitting element rather than after. An auxiliary electrode is formed before the formation of an electroluminescent layer; accordingly, the auxiliary electrode can be formed by photolithography. Further, a precise pattern can be formed by using photolithography. Thus, even if the width between light emitting elements is reduced to less than 20 µm due to the high precision, the auxiliary electrode can be formed to fit within the width. In addition, according to the invention, the auxiliary electrode is formed by photolithography together with a wiring and a gate electrode formed from a conductive film in a pixel area, thereby forming an auxiliary electrode without increasing the number of steps.

The auxiliary electrode can suppress the potential drop of a counter electrode and prevent brightness gradient from being observed in a pixel area. The invention is particularly effective in a light emitting device of the top emission type whose auxiliary electrode is difficult to be formed all over the counter electrode.

In the invention, an auxiliary electrode makes contact with a counter electrode of a light emitting element in a pixel area, although an electroluminescent layer is normally formed between a counter electrode and a pixel electrode in a pixel area. The electroluminescent layer includes a hole injection layer, a hole transport layer, a light emitting layer, an electron injection layer, an electron transport layer, and the like. The light emitting layer particularly has significantly high resistance compared with an auxiliary electrode or a counter electrode. Then, in the invention, the contact is formed by turning into advantage the weakness of inferiority in the step coverage of a light emitting layer in the end portion of the auxiliary electrode, which is caused since the thickness of the auxiliary electrode is thinner compared with that of the light emitting layer. Namely, an auxiliary electrode and a counter electrode are electrically connected in an area which is not covered with the light emitting layer due to the inferiority in step coverage. Note that a hole injection layer, a hole transport layer, an electron injection layer, an electron transport layer, and the like that are formed from materials with relatively low resistance compared with a light emitting layer may be provided between the auxiliary electrode and the counter electrode, thereby electrically connecting the auxiliary electrode and the counter electrode. Further, the film thickness of the auxiliary electrode may be set thicker than the film thickness of the whole electroluminescent layer, so that the coverage of the electroluminescent layer in the end portion of the auxiliary electrode is reduced; thus, the counter electrode and the auxiliary electrode have a direct contact with each other.

The method for connecting an auxiliary electrode and a counter electrode according to the invention is not limited to the method using the step coverage. Alternatively, when a light emitting layer is formed by vapor deposition using a metal mask, it is another option to form an area where the light emitting layer is not formed and to electrically connect the auxiliary electrode to the counter electrode. In the case of a full color display light emitting device which is fabricated by separately applying light emitting layers corresponding to each color of the three primary colors using a metal mask, the area where a light emitting layer is not formed can be formed by using the metal mask; thus, the contact can be made by employing the above method without increasing the number of steps.

In this specification, a light emitting device includes a panel in which a light emitting element is sealed and a module in which an IC having a controller and the like are mounted on the panel.

Further, an electroluminescent layer has a single layer or a plurality of layers, and an inorganic compound may be included therein. The luminescence in the electroluminescent layer includes luminescence that is generated when an singlet excited state returns to a ground state (fluorescence) and luminescence that is generated when an triplet exited state returns to a ground state (phosphorescence).

According to the invention, an auxiliary electrode can be formed by using a photolithography since the auxiliary electrode is formed before forming a light emitting element. Further, a precise pattern can be formed by using the photolithography. Accordingly, even if the width between light emitting elements is reduced to less than 20 µm due to the high precision, the auxiliary electrode can be formed to fit within the width. Further, according to the invention, the auxiliary electrode is formed by photolithography as the same as wirings of a pixel area, a gate electrode, and the like that are formed from a conductive film; thus, the auxiliary electrode can be formed without increasing the number of steps. The auxiliary electrode can suppress the potential drop of a counter electrode and prevent brightness gradient from being observed in a pixel area. The invention is particularly effective in a light emitting device of the top emission type whose auxiliary electrode is difficult to be formed all over the counter electrode.

BRIEF DESCRIPTION OF THE DRAWING

FIGS. 23A and 23B are cross-sectional views of a pixel in a light emitting device of the invention.

DETAILED DESCRIPTION OF THE INVENTION

Embodiment modes of the present invention will be described with reference to the accompanying drawings.

Note that the present invention can be implemented in various modes, and it is understood easily by those skilled in the art that embodiment modes and details of the indention can be variously changed without departing from the spirit and scope of the invention. Therefore, the present invention is not construed with a limitation on the contents of the embodiment modes.

EMBODIMENT MODE 1

Figure 1:
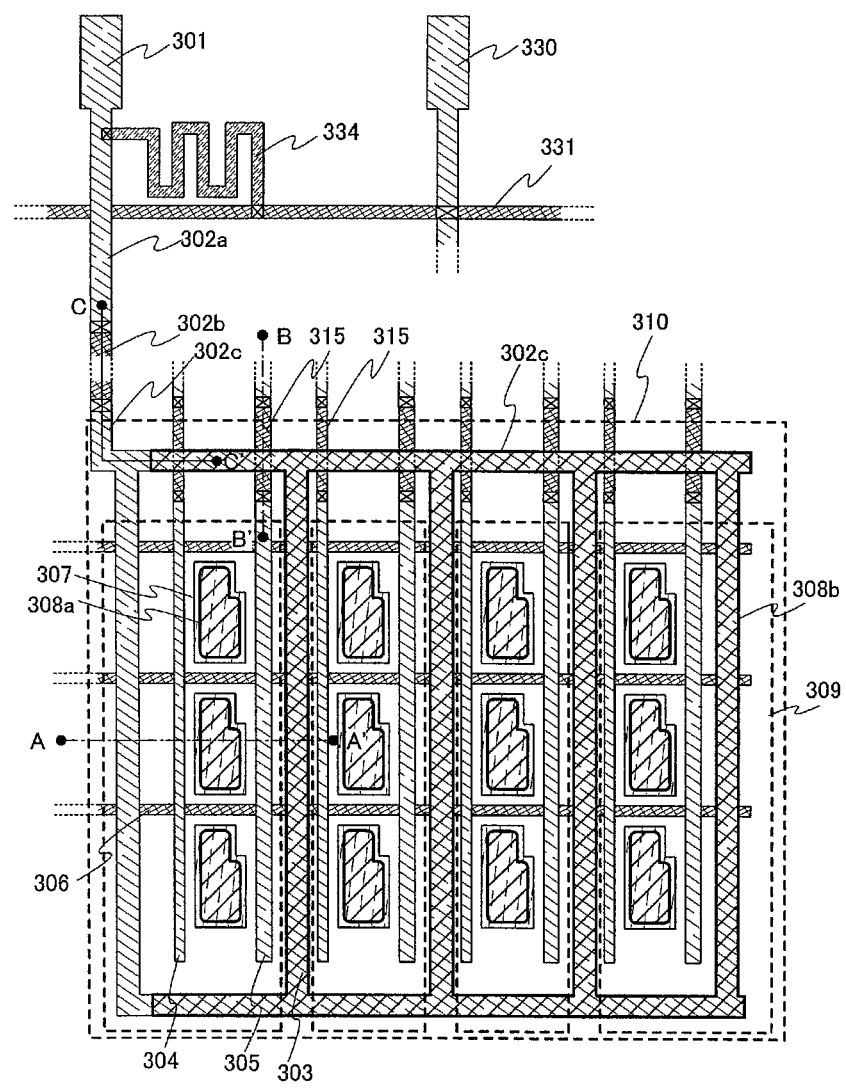
FIG. 1 is a figure showing a configuration of a pixel area in a light emitting device of the invention.

The configuration of a pixel area in a light emitting device of this embodiment mode will be described with reference to FIG. 1. FIG. 1 shows a top view of a pixel area and a leader wiring. Reference numeral 301 denotes a connection terminal, and reference numerals 302a, 302b, and 302c denote leader wirings. Further, an electrode 303 formed in the pixel area is equivalent to an auxiliary electrode, and the electrode is connected to the connection terminal 301 via the leader wirings 302a, 302b, and 302c. In FIG. 1, the connection terminal 301 and the auxiliary electrode 303 are electrically connected by using the three leader wirings of 302a, 302b, and 302c. However, the configuration of leader wirings is not limited to the configuration shown in FIG. 1, and any configuration may be used as long as the connection terminal 301 and the auxiliary electrode 303 can be connected electrically. All of a connection terminal, a leader wiring, and an auxiliary electrode may be formed from one conductive film.

A plurality of wirings are provided in the pixel area; specifically in this embodiment mode, the pixel area has a scan line 306 for selecting a pixel, a signal line 304 for supplying a video signal to the selected pixel, and a power line 305 for supplying current to a light emitting element. Note that wirings to be provided in the pixel area of the invention is not limited to the three wirings, and some other wirings than the above wirings may be provided depending on the pixel structure.

Further, in this embodiment mode, in a step for forming the signal line 304 and the power line 305 by pattering one conductive film, the auxiliary electrode 303 is also formed. With the above structure, no more steps are required for forming the auxiliary electrode 303. The auxiliary electrode 303 is not necessarily formed from the conductive film for forming the signal line 304 and the power line 305. The auxiliary electrode 303 may be formed in a step for forming another wiring for example, a scan line 306, aside from the signal line 304 and the power line 305.

As in this embodiment mode, when the signal line 304 and the power line 305 are formed from the same conductive film as the leader wiring 302c, the signal line 304 and the power line 305 are connected to a wiring 315 formed in another layer so as to pass under the leader wiring 302c; thus, the signal line 304 and the power line 305, and the leader wiring 302c can be crossed so as not to contact each other.

In FIG. 1, reference numeral 307 denotes a pixel electrode (a first electrode), and an electrode in one pixel is separated from those in the other pixels. An electroluminescent layer corresponding to each color is formed in each of a plurality of areas shown by dashed lines 309. Further, a counter electrode (a second electrode) is formed in an area shown by dashed lines 310, and an electroluminescent layer 309 is sandwiched between the pixel electrode 307 and the counter electrode 310. In this embodiment mode, an example in which an anode is used as a pixel electrode, and a cathode is used as a counter electrode is shown; however, the invention is not limited to the configuration. The cathode may be used as a pixel electrode, and the anode may be used as a counter electrode.

In FIG. 1, the leader wiring 302a is connected to one end portion of a resistor 334 formed from a semiconductor film, and the other end of the resistor 334 is electrically connected to a connection terminal 330 via a wiring 331. Noise of a signal inputted into the connection terminal 301 can be reduced, and the subsequent circuit element can be prevented from being damaged by static electricity or the like by providing the resistor 334.

Figure 2A:
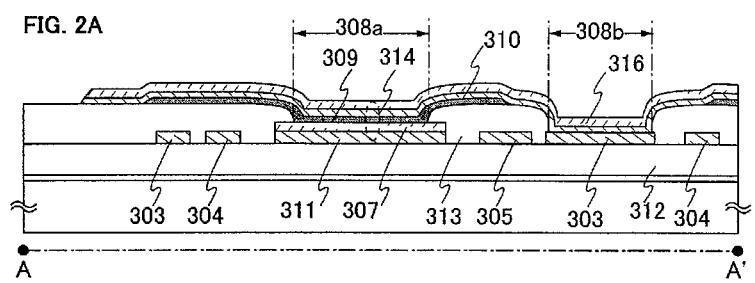
FIGS. 2A to 2C are cross-sectional views of a pixel area shown in FIG. 1.
Figure 2B:
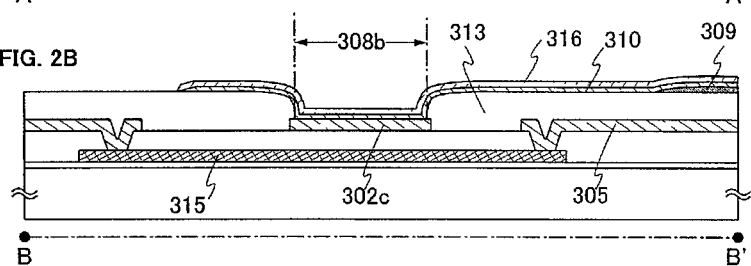
Figure 2C:
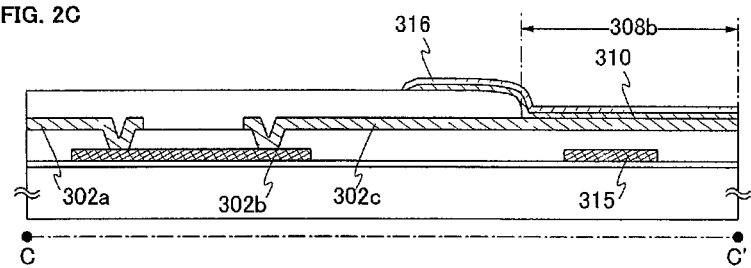

A cross-sectional view of A-A' in FIG. 1 is shown in FIG. 2A. A cross-sectional view of B-B' in FIG. 1 is shown in FIG. 2B. A cross-sectional view of C-C' in FIG. 1 is shown in FIG. 2C. As shown in FIG. 2A, a wiring 311 (hereinafter referred to as a connection wiring) for giving potential to the pixel electrode 307 depending on a video signal inputted into a pixel is provided as well as the signal line 304, the power line 305, and the auxiliary electrode 303 over a first interlayer insulating film (a first insulating film) 312. Further, the pixel electrode 307 is formed over the connection wiring 311. The counter electrode 310 is formed from a light transmitting electrode, and light generated in the electroluminescent layer 309 reflects off the connection wiring 311; thus, the light can be released from the side of the counter electrode 310.

As in this embodiment mode, in the case of a top emission light emitting device, a light transmitting cathode is used for the counter electrode 310. Specifically, an electrode having a film thickness thin enough to transmit the light generated in the electroluminescent layer is used. Preferably, the film thickness is approximately 5 nm to 30 nm. Further, a transparent conductive film 316 which transmits light is formed so as to cover the counter electrode 310 in this embodiment mode. Even if the resistance of the counter electrode 310 itself is increased by thinning the thickness thereof, potential drop can be suppressed by providing the transparent conductive film 316. However, the transparent conductive film 316 is not necessarily provided.

In this embodiment mode, the configuration in which light emitted from an electroluminescent layer is released from the counter electrode side is described; however, the invention is not limited to the configuration. A type in which light is released from the pixel electrode side (a bottom emission type) or a type in which light is released from both the counter electrode side and the pixel electrode side (a dual emission type) may be used.

A second interlayer insulating film (a second insulating film) 313 is formed over the first interlayer insulating film 312 so as to cover the end portion of the pixel electrode 307, the signal line 304, the power line 305, the end portion of the leader wiring 302c, and the end portion of the auxiliary electrode 303. The second interlayer insulating film 313 has openings 308a and 308b. A part of the pixel electrode 307, a part of the leader wiring 302c, and a part of the auxiliary electrode 303 are exposed in the openings 308a and 308b. In the opening 308a, the pixel electrode 307, the electroluminescent layer 309, and the counter electrode 310 are overlapped with each other, thus forming the light emitting element 314.

In this embodiment mode, when an electroluminescent layer corresponding to each color of the three primary colors is formed by vapor deposition using a metal mask, an area where the light emitting layer is not formed is formed, and the auxiliary electrode and the counter electrode are electrically connected in the area. Specifically, the opening 308b and the area where the electroluminescent layer 309 is formed are made completely not to overlap, or to overlap only partially. In other words, the counter electrode 310 is to be formed in a state where the auxiliary electrode 303 is exposed completely or partially in the opening 308b. With the above structure, the auxiliary electrode 303 can be connected to the counter electrode 310 in the opening 308b. Further in this embodiment mode, the electrical connection between the counter electrode 310 and the auxiliary electrode 303 can be made more firm by forming the transparent conductive film 316 so as to cover the counter electrode 310. With the above structure, the auxiliary electrode 303 can be connected to the counter electrode 310 in the pixel area.

Meanwhile, the electroluminescent layer 309 is not formed between the leader wiring 302c and the counter electrode 310. Accordingly, as shown in FIG. 2B, the leader wiring 302c and the counter electrode 310 are connected in the opening 308b. Further, the power supply potential supplied from the connection terminal 301 is supplied to the auxiliary electrode 303 and the counter electrode 310 through the leader wiring 302c. The potential drop of the counter electrode 310 can be suppressed and brightness gradient can be prevented from being observed in the pixel area by using the auxiliary electrode 303. The invention is particularly effective in a light emitting device of the top emission type whose auxiliary electrode is difficult to be formed all over the counter electrode.

According to the invention, an auxiliary electrode is formed before the formation of a light emitting layer, so that the auxiliary electrode can be formed by photolithography. Further, a precise pattern can be formed by using photolithography. Accordingly, even if the width between light emitting elements is reduced to less than 20 μm due to the high precision, the auxiliary electrode can be formed to fit within the width. Further, according to the invention, the auxiliary electrode is formed by photolithography as the same as a wiring of a pixel area or a gate electrode that are formed from one conductive film; thus, the auxiliary electrode can be formed without increasing the number of steps.

Note that, in this embodiment mode, the leader wiring 302c and the auxiliary electrode 303 are connected to the counter electrode 310 in the one opening 308b. The shape of the opening is not limited to this embodiment mode. An opening for exposing the leader wirings 302a, 302b, and 302c and an opening for exposing the auxiliary electrode 303 may be separated, or a plurality of openings for exposing the auxiliary electrode 303 may be provided.

Further, in this embodiment mode, a case where an electroluminescent layer of one color is separated from those of other colors is described. However, at least a light emitting layer should be separated, and a hole injection layer, a hole transport layer, an electron injection layer, and an electron transport layer that are formed from materials with relatively low resistance compared with the light emitting layer may not be necessarily separated. In this case, the counter electrode can be electrically connected to the auxiliary electrode via one of a hole injection layer, a hole transport layer, an electron injection layer, and an electron transport layer.

As in this embodiment mode, in the case of a full color display light emitting device which is fabricated by separately coloring a light emitting layer corresponding to each color of the three primary colors using a metal mask, the area where light emitting layer is not formed can be formed by using the metal mask; thus, the contact can be made without increasing the number of steps by employing the above method. Note that the electroluminescent layer formed in the opening may be selectively removed by plasma etching using a metal mask, and one or more gases selected from Ar, H, F, and O as an etching gas.

EMBODIMENT MODE 2

In this embodiment mode, a mode of a shape of an opening, which is different from the one in Embodiment Mode 1 will be described.

Figure 3:
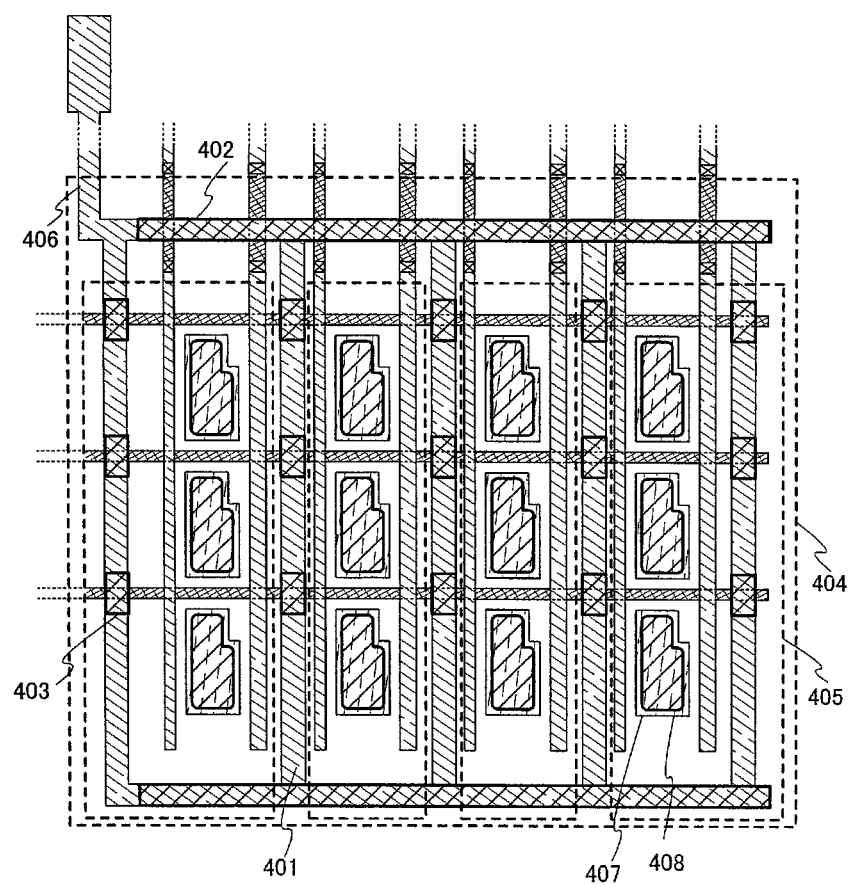
FIG. 3 is a figure showing a configuration of a pixel area in a light emitting device of the invention.

FIG. 3 shows a top view of a pixel area in this embodiment mode. Reference numeral 403 denotes an opening, and a counter electrode 404 and an auxiliary electrode 401 are electrically connected in an opening 403. In this embodiment mode, when an electroluminescent layer 405 is formed so as not to entirely cover the opening 403 by using a metal mask; thus, the auxiliary electrode 401 is connected to the counter electrode 404 directly or electrically in the opening 403. In this case, the end portion of the auxiliary electrode may be exposed in the opening, or may be covered with a second interlayer insulating film.

The end portion of the auxiliary electrode 401 may be exposed in the opening 403, and a part which is not covered by the electroluminescent layer 405 may be deliberately provided in the end portion by means of coverage thereby connecting the counter electrode 404 and the auxiliary electrode 401.

A leader wiring 406 is partially exposed in an opening 402. Since the opening 402 is not overlapped with the electroluminescent layer 405, the leader wiring 406 and the counter electrode 404 are connected in the opening 402.

Reference numeral 407 denotes a pixel electrode provided for each pixel. Further, the pixel electrode 407, the electroluminescent layer 405, and the counter electrode 404 are overlapped in an opening 408, and thus, a light emitting element is formed.

As shown in FIG. 3, short-circuit between the opening 408 and another adjacent wiring with the misalignment of a mask in forming the openings 403 and 408 can be inhibited by arranging the openings 403 at the four corners of the opening 408 where each light emitting element is formed.

EMBODIMENT MODE 3

In this embodiment mode, a mode in which a structure of a portion where an auxiliary electrode and a counter electrode are connected is different from that of Embodiment Mode 1 will be described.

Figure 9:
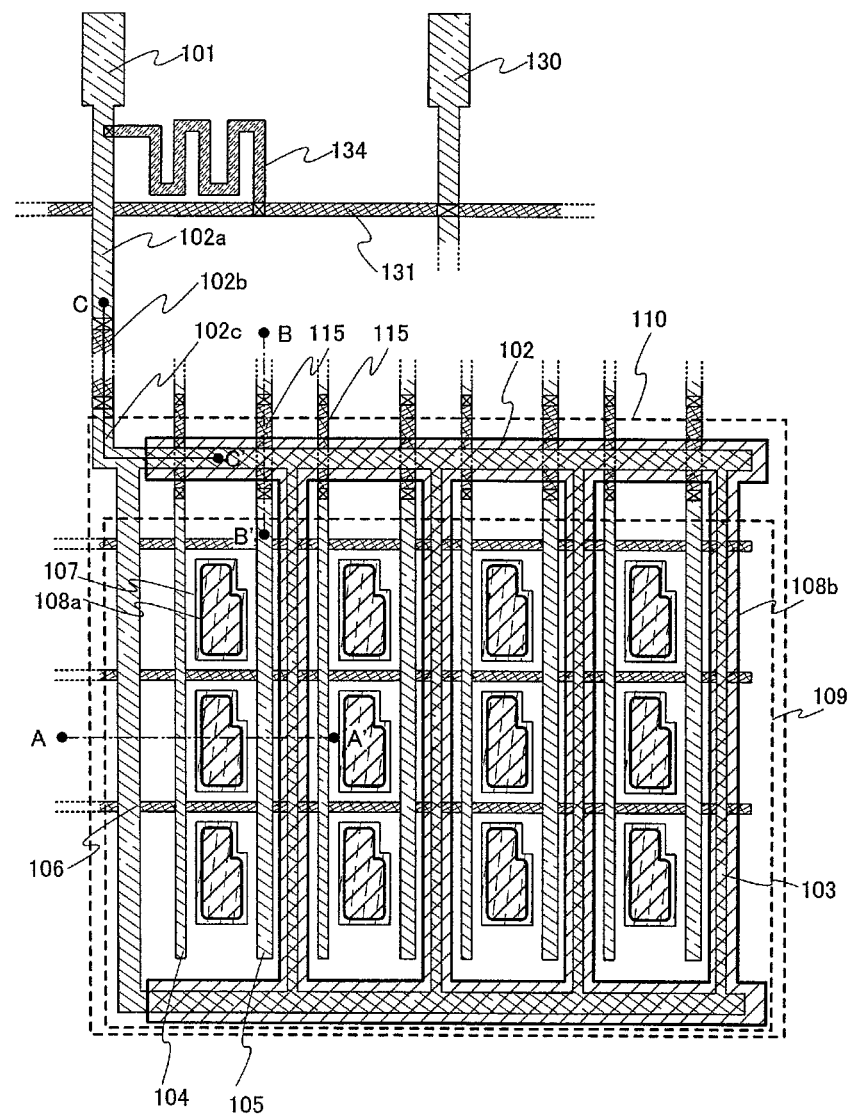
FIG. 9 is a figure showing a configuration of a pixel area in a light emitting device of the invention.

The configuration of a pixel area in a light emitting device of this embodiment mode will be described with reference to FIG. 9. FIG. 9 shows a top view of a pixel area and a leader wiring. Reference numeral 101 denotes a connection terminal, 102a, 102b, 102c denote leader wirings, and 103 denotes an auxiliary electrode. As in FIG. 1, the auxiliary electrode 103 is electrically connected to the connection terminal 101 via leader wirings 102a, 102b, and 102c.

As in Embodiment Mode 1, a scan line 106, a signal line 104, and a power line 105 are provided in the pixel area. The wirings to be provided in the pixel area of the invention is not limited to the three wirings, and some other wirings than the above wirings may be provided depending on the pixel structure. Further, as in Embodiment Mode 1, in this embodiment mode, the auxiliary electrode 101 is formed in a step for forming the signal line 104 and the power line 105 by patterning one conductive film. With the above structure, no more steps are required for forming the auxiliary electrode 103. Note that it is not necessarily needed that the auxiliary electrode 103 is formed by patterning the same conductive electrode as the signal line 104 and the power line 105. The auxiliary electrode 103 may be formed in a step for forming another wiring, for example, a scan line, aside from the signal line 104 and the power line 105.

In FIG. 9, reference numeral 107 denotes a pixel electrode. In this embodiment mode, an electroluminescent layer is formed in an area shown by dashed lines 109. Further, a counter electrode is formed in an area shown by dashed lines 110, and the electroluminescent layer 109 is sandwiched between the pixel electrode 107 and the counter electrode 110.

In FIG. 9, the leader wiring 102a and one end of a resistor 134 formed from a semiconductor film are connected, and the other end of the resistor 134 is electrically connected to a connection terminal 130 via a wiring 131. Noise of a signal inputted into the connection terminal 101 can be reduced, and a subsequent circuit element can be prevented from being damaged due to static electricity or the like by providing the resistor 134.

Figure 10A:
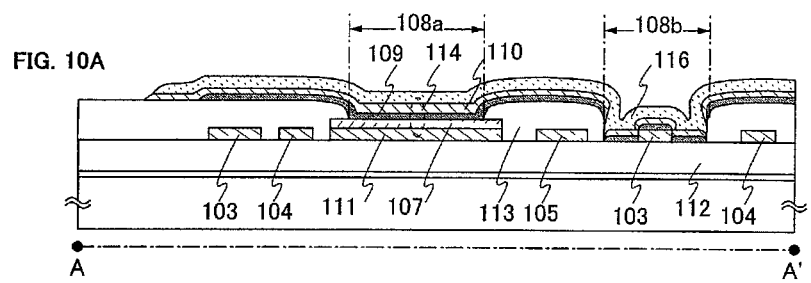
FIGS. 10A to 10C are cross-sectional views of a pixel area shown in FIG. 9.
Figure 10B:
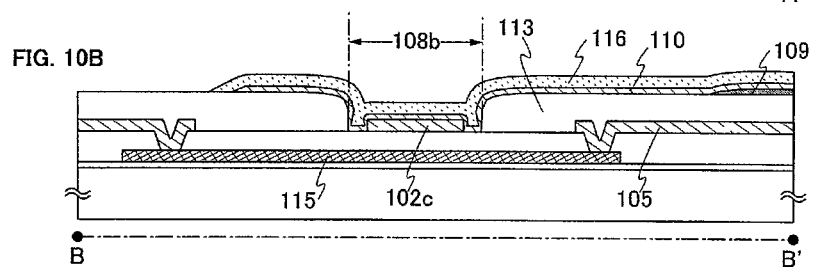
Figure 10C:
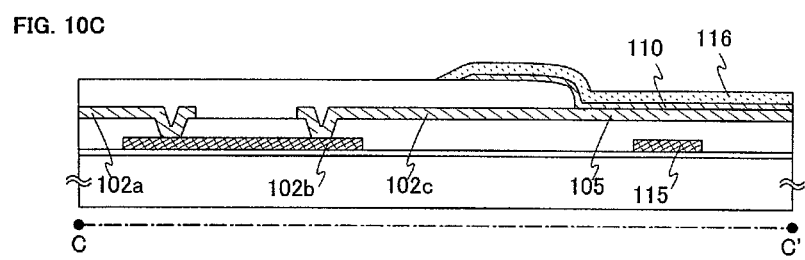

A cross-sectional view of A-A' in FIG. 9 is shown in FIG. 10A. A cross-sectional view of B-B' in FIG. 9 is shown in FIG. 10B. As shown in FIG. 10A, a wiring 111 is provided as well as the signal line 104, the power line 105, and the auxiliary electrode 103 are formed over a first interlayer insulating film 112, and the pixel electrode 107 is formed on the connection wiring 111 as in Embodiment Mode 1. Further, the counter electrode 110 is formed from a light transmitting electrode, and light generated in the electroluminescent layer 109 reflects off the connection wiring 111; thus, the light can be released from the side of the counter electrode 110.

A second interlayer insulating film 113 is formed over the first interlayer insulating film 112 so as to cover the end portion of the pixel electrode 107, the signal line 104 and the power line 105. The second interlayer insulating film 113 has openings 108a and 108b. A part of the pixel electrode 107, a part of the leader wiring 102, and the auxiliary electrode 103 are exposed in the openings 108a and 108b. In the opening 108a, the pixel electrode 107, the electroluminescent layer 109, and the counter electrode 110 are overlapped with each other, thus forming a light emitting element 114. Note that, in FIG. 9, the end portion of the auxiliary electrode 103 is not exposed in the opening 108b and covered with the second interlayer insulating film 113; however, this embodiment mode is not limited to the configuration. The end portion of the auxiliary electrode 103 may be exposed.

In the opening 108b, the electroluminescent layer 109 is formed in a state where the end portion of the auxiliary electrode 103 is exposed without being covered with the second interlayer insulating film 113. Accordingly, when the electroluminescent layer 109 is formed by vapor deposition, the auxiliary electrode 103 is partially but not completely covered with the electroluminescent layer 109; thus, the uncovered portion is connected to the counter electrode 110.

Figure 11:
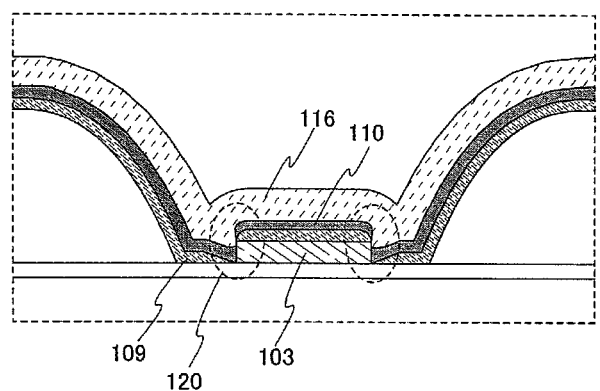
FIG. 11 is a figure showing a configuration of a connecting portion between an auxiliary wiring and a counter electrode in a light emitting device of the invention.

In FIG. 11, an enlarged view of a portion where the auxiliary electrode 103 and the counter electrode 110 are connected is shown. In this embodiment mode as shown in FIG. 11, when the electroluminescent layer 109 is formed by vapor deposition, the auxiliary electrode 103 is formed to be covered partially but not completely. The counter electrode 110 is formed thereafter, so that the exposed end portion of the auxiliary electrode 103 and the counter electrode 110 are connected as shown in the area 120 enclosed by dashed lines. Further in this embodiment mode, the electrical connection between the counter electrode 110 and the auxiliary electrode 103 can be made more firm by forming the transparent conductive film 116 so as to cover the counter electrode 110. With the above structure, the auxiliary electrode 103 can be connected to the counter electrode 110 in the pixel area.

In this embodiment mode, an example in which an anode is used as a pixel electrode, and a cathode is used as a counter electrode is shown; however, the invention is not limited to the configuration. The cathode may be used as a pixel electrode, and the anode may be used as a counter electrode. Further, in this embodiment mode, a top emission light emitting device is employed. As in Embodiment Mode 1, a light transmitting electrode is used for the counter electrode 110, and a transparent conductive film 116 which transmit light is formed so as to cover the counter electrode 110. Even if the resistance of the counter electrode 110 itself is increased by thinning the thickness thereof, potential drop can be suppressed by providing the transparent conductive film 116. However, the transparent conductive film is not necessarily provided.

In this embodiment mode, the configuration in which light emitted from an electroluminescent layer is released from the counter electrode side is described; however, the invention is not limited to the configuration. A type in which light is released from the pixel electrode side (a bottom emission type) or a type in which light is released from both the counter electrode side and the pixel electrode side (a dual emission type) may be used.

Meanwhile, the electroluminescent layer 109 is not formed between the leader wiring 102 and the counter electrode 110. Accordingly, as shown in FIG. 2B, the leader wiring 102 and the counter electrode 110 are connected in the opening 108b. Further, the power supply potential supplied from the connection terminal 101 is supplied to the auxiliary electrode 103 and the counter electrode 110 through the leader wiring 102. The potential drop of the counter electrode 110 can be suppressed and brightness gradient can be prevented from being observed in the pixel area by using the auxiliary electrode 103. The invention is particularly effective in a light emitting device of the top emission type whose auxiliary electrode is difficult to be formed all over the counter electrode.

In this embodiment mode, an auxiliary electrode is exposed, and the auxiliary electrode and a counter electrode are connected by making use of the coverage characteristics of an electroluminescent layer. However, the invention is not limited thereto. The area where an electroluminescent layer is not formed is formed in the pixel area, and an auxiliary electrode may make contact with a counter electrode in the area. Further, in this embodiment mode, a case where an electroluminescent layer is wholly formed by vapor deposition is described; however, at least a light emitting layer should be formed by vapor deposition, and a hole injection layer, a hole transport layer, an electron injection layer, an electron transport layer, and the like that are formed from materials with relatively low resistance compared with the light emitting layer may be formed by an application method without limitation to vapor deposition. In this case, the auxiliary electrode and the counter electrode can be electrically connected via a hole injection layer, a hole transport layer, an electron injection layer, or an electron transport layer in the area where a light emitting layer is not formed in the end of an auxiliary electrode.

According to the invention, an auxiliary electrode can be formed by using a photolithography since the auxiliary electrode can be formed before forming a light emitting element. Further, a precise pattern can be formed by using the photolithography. Accordingly, even if the width between light emitting elements is reduced to less than 20 μm due to the high precision, the auxiliary electrode can be formed to fit within the width. Further, according to the invention, the auxiliary electrode is formed by photolithography as the same as wirings of a pixel area, a gate electrode, and the like that are formed from a conductive film; thus, the auxiliary electrode can be formed without increasing the number of steps.

Note that, in this embodiment mode, the leader wiring 102 and the auxiliary electrode 103 are connected to the counter electrode 110 in the one opening 108b; however, the shape of the opening is not limited to this embodiment mode. An opening for exposing the leader wiring 102 and an opening for exposing the auxiliary electrode may be separated, or a plurality of openings for exposing the auxiliary electrode may be provided.

EMBODIMENT MODE 4

In this embodiment mode, a mode of a light emitting element included in a light emitting device of the invention will be described. FIG. 4A shows a cross-sectional view of a pixel of this embodiment mode. Enlarged views of a portion which is enclosed by dashed lines 570 and a portion enclosed by dashed lines 571 in FIG. 4A are respectively shown in FIG. 4B and FIG. 4C.

In FIG. 4A, a base film 501 is formed over a substrate 500, and a transistor 502 which controls supply of current to a light emitting element (a driver transistor) is formed over the base film 501. The driver transistor 502 includes an active layer 503, a gate electrode 505, and a gate insulating film 504 sandwiched between the active layer 503 and the gate electrode 505.

It is preferable to use a polycrystalline semiconductor film for the active layer 503, and the polycrystalline semiconductor film can be formed by crystallizing an amorphous silicon film by a known technology. As the known technology of crystallization, thermo-crystallization using an electrically heated furnace, laser annealing crystallization using a laser beam, and a lamp annealing crystallization using infrared light are given. In this embodiment mode, the crystallization is performed by an excimer laser beam using XeCl gas. It should be noted that a pulsed excimer laser beam which is shaped into a linear beam is used in this embodiment mode; however, the excimer laser beam may be rectangular, or a continuous-wave argon laser beam or a continuous-wave excimer laser beam can also be used. Alternatively, the polycrystalline semiconductor film may be formed by a crystallization method using a catalytic element according to a technique described in Japanese Patent Laid-Open No. Hei 07-130652. Further, a polycrystalline semiconductor film formed by sputtering, PCVD, thermal CVD, or the like may be used.

As for the active layer, silicon germanium can be used instead of silicon. When silicon germanium is used, the concentration of germanium is preferably set at approximately from 0.01 atomic % to 4.5 atomic %. Further, silicon added with carbon nitride may be used.

The gate insulating film 504 can use silicon oxide, silicon nitride, or silicon oxynitride. Further, a layered film of the compounds, for example, a film in which SiN is stacked on $SiO_2$ may be used as the gate insulating film. TEOS (tetraethyl orthosilicate) and $O_2$ are mixed in plasma CVD, and discharged under the following conditions: reaction pressure of 40 Pa, the substrate temperature from 300° C. to 400° C., high frequency of 13.56 MHz, and the power density in a range of 0.5 W/cm$^2$ to 0.8 W/cm$^2$, thereby forming a silicon oxide film. Then, the silicon oxide film thus prepared can obtain excellent characteristics as a gate insulating film by thermo-annealing at a temperature from 400° C. to 500° C. Further, aluminum nitride may be used for the gate insulating film. Aluminum nitride has relatively high thermal conductivity, it can effectively diffuse the heat generated at a TFT. Furthermore, after silicon oxide, silicon oxynitride, or the like which does not contain aluminum is formed, aluminum nitride may be stacked thereover to be used as a gate insulating film. Alternatively, $SiO_2$ formed by RF sputtering using Si as a target may be used for the gate insulating film.

The gate electrode 505 is formed from an element selected from Ta, W, Ti, Mo, Al and Cu, or an alloy material or a compound material containing the above elements as major components. A semiconductor film typified by a polycrystalline silicon film into which an impurity element such as phosphorus has been doped may also be used. Moreover, it may be a laminate of a plurality of conductive films instead of a single conductive film.

For example, the following combinations are preferable: a first conductive film is formed from tantalum nitride (TaN) and a second conductive film is formed from W; the first conductive film is formed from tantalum nitride (TaN) and the second conductive film is formed from Ti; the first conductive film is formed from tantalum nitride (TaN) and the second conductive film is formed from Al; and the first conductive film is formed from tantalum nitride (TaN) and the second conductive film is formed from Cu (copper). Moreover, a semiconductor film typified by a polycrystalline silicon film in which an impurity element such as phosphorus has been doped, or Ag—Pd—Cu alloy may also be used for the first conductive film and the second conductive film.

The structure of the conductive film is not limited to the two-layer structure; for example, a three-layer structure in which a tungsten film, an alloy film containing aluminum and silicon (Al—Si), and a titanium nitride film are stacked in sequence may be used. Further, in the case of the three-layer structure, tungsten nitride may be used instead of tungsten; an alloy film of aluminum and titanium (Al—Ti) may be used instead of an alloy film of aluminum and silicon (Al—Si); or a titanium film may be used instead of a titanium nitride film. Note that it is important to select the most suitable method of etching, and a kind of an etchant depending on materials of the conductive film.

The driver transistor 502 is covered with a first interlayer insulating film 507, and a passivation film 508 is stacked over the first interlayer insulating film 507.

The first interlayer insulating film 507 can use non-photosensitive acrylic, an oxide film, or a silicon oxynitride film. The passivation film 508 uses a film which hardly transmits a substance which may accelerate deterioration of a light emitting element, such as moisture or oxygen, compared with other insulating films. Typically, a DLC film, a carbon nitride film, a silicon nitride film formed by RF sputtering, or the like is desirably used for the passivation film. Further, the passivation film 508 can prevent alkali metal, alkaline earth metal, or transition metal contained in an electron injection layer 513 from leaking out of the panel.

A connection wiring 506 is formed over the passivation film 508, and the driver transistor 502 is connected to the connection wiring 506 through a contact hole. Further, an auxiliary electrode 520 which is obtained by patterning a conductive film from which the connection wiring 506 is also formed is formed over the passivation film 508.

Reference numeral 510 denotes a pixel electrode, 511 denotes a hole injection layer, 512 denotes a light emitting layer, and 513 denotes an electron injection layer. The pixel electrode 510 is formed on the connection wiring 506, and a second interlayer insulating film 523 having openings 521 and 522 for exposing a part of the pixel electrode 510 and a part of the auxiliary electrode 520 is formed over the passivation film 508. Further, the hole injection layer 511, the light emitting layer 512, and the electron injection layer 513 are formed in sequence so as to cover the passivation film 508 and the opening 521.

In this embodiment mode, the pixel electrode 510, the hole injection layer 511, the light emitting layer 512, and the electron injection layer 513 overlap in the opening 521, and the overlapping portion is equivalent to a light emitting element 514. Note that the light emitting layer 512 is formed by using a metal mask 572 so as not to cover the opening 522 completely and to expose the auxiliary electrode 520 partially. Accordingly, the hole injection layer 511 and the electron injection layer 513 are sequentially stacked over the auxiliary electrode 520 in the opening 522. The portion where the pixel electrode 510, the hole injection layer 511, the light emitting layer 512, and the electron injection layer 513 overlap is equivalent to the light emitting element 514.

In this embodiment mode, a polyethylene dioxythiophene-polystyrene sulfonate (PEDOT/PSS) thin film, for example, can be formed for the hole injection layer 511 by an application method.

The electron injection layer of this embodiment uses an electron injection composition in which molar ratio of a benzoxazole derivative and one of an alkali metal, an alkaline earth metal, and a transition metal (for example, Li, Mg, Cs, or the like) is from 1:0.1 to 1:10. And the electron injection layer 513 having the above structure is used instead of a counter electrode. In this embodiment mode, the molar ratio of the benzoxazole derivative represented by the formula 1 to Li, that is an alkali metal, is made to be 2:1 thereby forming the electron injection layer with a film thickness of 20 nm by co-evaporation.

Formula 1

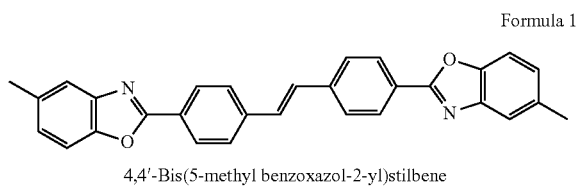

4,4'-Bis(5-methyl benzoxazol-2-yl)stilbene

Over the electron injection layer 513, a protective film 524 is formed. As with the passivation film 508, the protective film 524 is formed with a film which hardly transmits a substance which may accelerate deterioration of a light emitting element, such as moisture or oxygen, compared with other insulating films. Typically, a DLC film, a carbon nitride film, a silicon nitride film formed by RF sputtering, or the like is desirably used for the protective film 508. A laminate of the film which hardly transmits substances such as moisture and oxygen, and a film which transmits substances such as moisture and oxygen easily compared with the above film may also be used for the protective film.

The second interlayer insulating film 523 is heated in a vacuum atmosphere in order to remove absorbed moisture and oxygen before forming the hole injection layer 511, the light emitting layer 512, and the electron injection layer 513. Specifically, heat treatment is applied in a vacuum atmosphere, at a temperature from 100° C. to 200° C. and for approximately 0.5 to 1 hour. The pressure is desirably set at $3\times10^{-7}$ Torr or less, and if possible at $3\times10^{-8}$ Torr or less. In the case where the hole injection layer 511, the light emitting layer 512, and the electron injection layer 513 are formed after performing the heat treatment to the second interlayer insulating film 523 in the vacuum atmosphere, the reliability can be further improved by keeping the hole injection layer 511, the light emitting layer 512, and the electron injection layer 513 under the vacuum atmosphere until immediately before the film formation.

End potions of the opening 521 of the second interlayer insulating film 523 are preferably formed to be rounded. Thus, the light emitting layer 512 partially overlapped with the interlayer insulating film 523 can be prevented from being broken at the end portions. Specifically, a radius of curvature of a curve which is drawn by a cross section of the second interlayer insulating film in the opening is desirably in the range of 0.2 μm to 2 μm approximately.

With the above structure, the coverage of the hole injection layer 511, the light emitting layer 512, and the electron injection layer 513 which are to be formed later can be improved, and the pixel electrode 510 and the electron injection layer 513 can be inhibited from being short circuited in a hole formed in the light emitting layer 512. Moreover, by alleviating the stress of the light emitting layer 512, a defect called shrink in which a light emitting region is diminished can be suppressed, and thus, the reliability can be improved.

Figure 14:
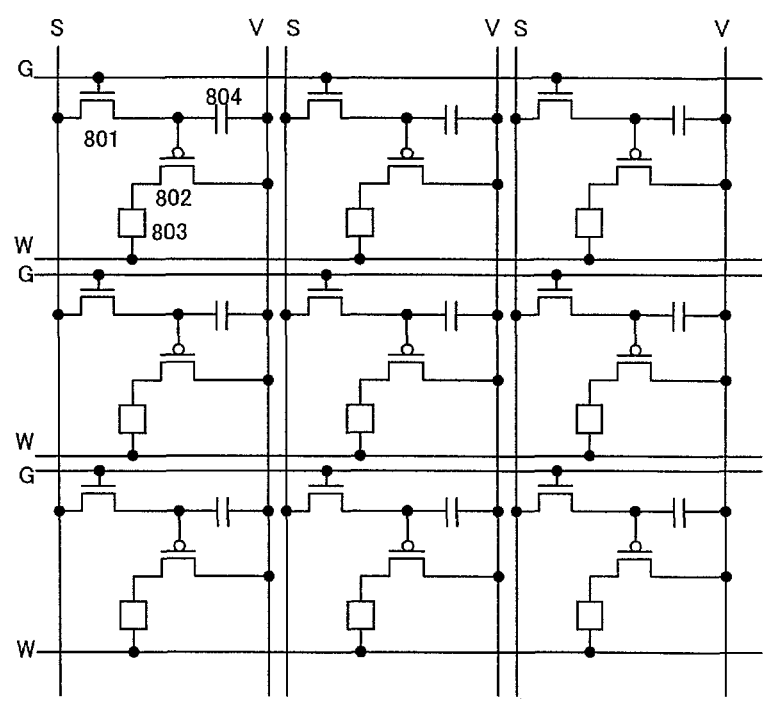
FIG. 14 is a schematic diagram of a pixel area in a light emitting device of the invention.

FIG. 14 shows an example of using a positive photosensitive acrylic resin as the second interlayer insulating film 523. A photosensitive organic resin includes a positive type in which a portion exposed to an energy beam such as light, electrons, and ions is removed, and a negative type in which the exposed portion remains. In the invention, a negative photosensitive organic resin film may be used. Alliteratively, the second interlayer insulating film 523 may be formed from photosensitive polyimide. When forming the second interlayer insulating film 523 by using negative photosensitive acryl, a sectional shape of the end portions of the opening 521 has an S-like shape. At this time, the radius of curvature at the upper and the lower end portions of the opening are desirably in the range of 0.2 μn to 2 μm.

The first interlayer insulating film 507 or the second interlayer insulating film 523 may be formed from a photosensitive organic resin used for a photoresist. In that case, for example, a solution obtained by dissolving a cresol resin which is a kind of photosensitive organic resin into propylene glycolmonomethyl ether acetate (PGMEA) is applied to the substrate, and the substrate is baked. Next, since the cresol resin is a positive photosensitive organic resin, the portion where an opening is to be formed is exposed by using a photomask. And after the development using a developing solution, the substrate is dried, baking at 120° C. to 250° C. (for example, 125° C.) for approximately one hour is performed thereafter; thus, the opening can be formed. Note that, before baking after the development, baking with slightly lower temperature than the temperature of the baking (for example, around 100° C.) may be performed as pre-bake. The aspect ratio can be improved so that the aperture of the contact hole to be provided in forming the connection wiring 506 is small relative to its depth by using a photosensitive organic resin for the first interlayer insulating film 507. Further, when the above cresol resin is used for the first interlayer insulating film 507, moisture can be prevented from being released from the first interlayer insulating film 507; accordingly, the passivation film 508 is not necessary for suppressing deterioration of the light emitting element 514. Consequently, a short circuit between the pixel electrode and the counter electrode caused by a dust which is generated from the silicon nitride film used for the passivation film 508 can be prevented.

The second interlayer insulating film is not limited to the above organic resin film and may be an inorganic insulating film, such as silicon oxide.

Figure 4:
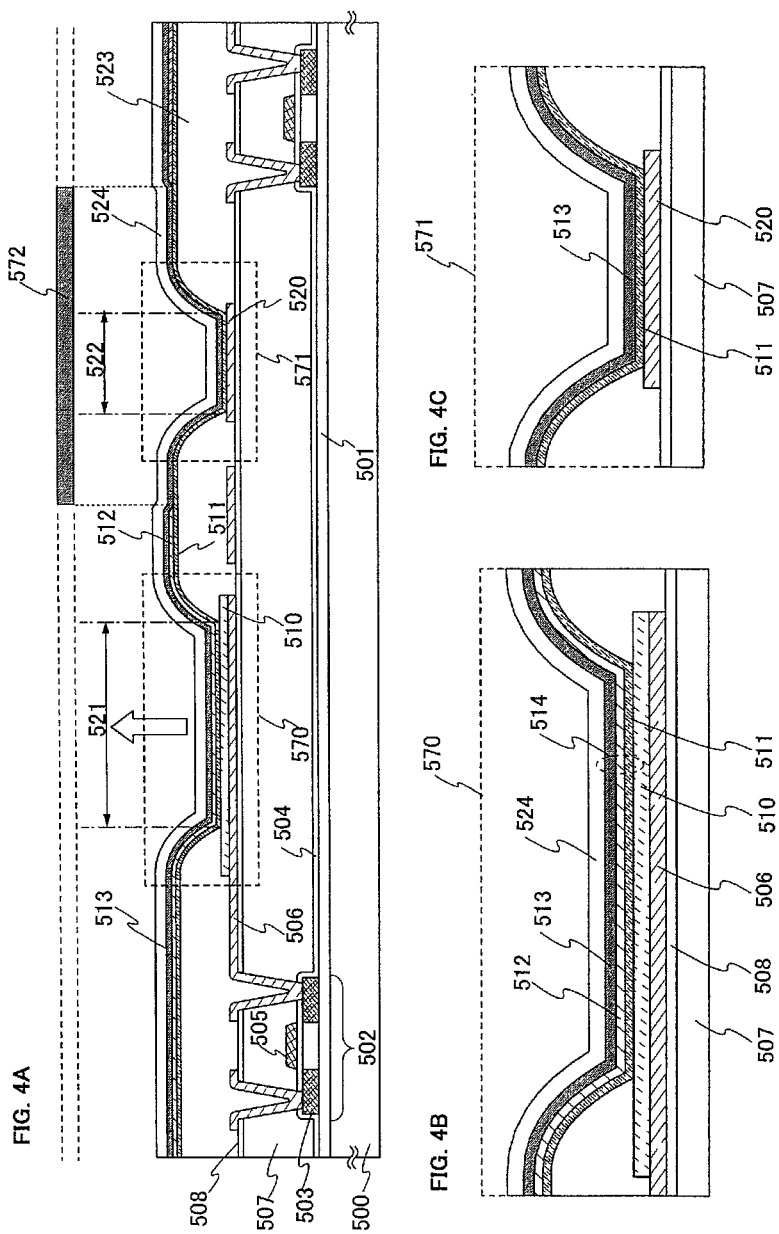
FIGS. 4A to 4C are cross-sectional views of a pixel area in a light emitting device of the invention.

The pixel electrode 510 can be formed from not only ITO, IZO, or ITSO but also the transparent conductive film in which indium oxide is mixed with tin oxide (ZnO) by 2% to 20% may be used. For the pixel electrode 510, a titanium nitride film or a titanium film may be used other than the above transparent conductive film. In FIG. 4, ITO is used for the pixel electrode 510. The pixel electrode 510 may be polished by CMP method or by cleaning with a porous body of polyvinyl alcohol so that the surface of the pixel electrode 510 is made flat. Furthermore, the surface of the pixel electrode 510 may be irradiated with an ultraviolet ray or may be treated with oxygen plasma after the CMP polishing.

FIGS. 4A to 4C show a configuration in which light emitted from the light emitting element is released to the side of the substrate 500; however, another configuration in which light is emitted toward the direction opposite to the substrate may be employed for the light emitting element.

Having completed to the stage shown in FIGS. 4A to 4C, it is preferable to perform packaging (sealing) with a protective film (a laminated film, a UV curable resin film or the like) or a transparent cover material which has high airtightness with a little degassing thereby avoiding exposure to the outside air. On this occasion, if the inside of the cover material is filled with an inert atmosphere or a hygroscopic material (e.g., barium oxide) is provided inside, the reliability of OLED is improved.

The invention is not limited to the fabrication method described above, and the light emitting element can be fabricated by using known methods.

Figure 22A:
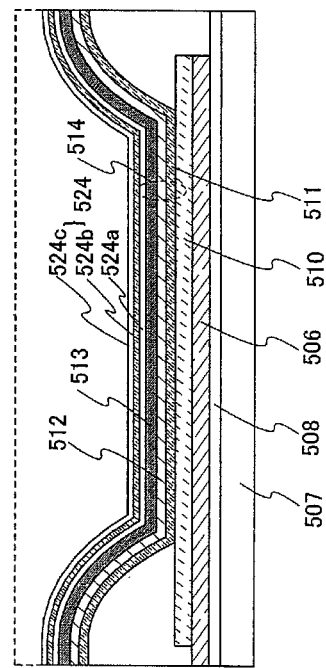
FIGS. 22A and 22B are cross-sectional views of a pixel in a light emitting device of the invention.
Figure 22B:
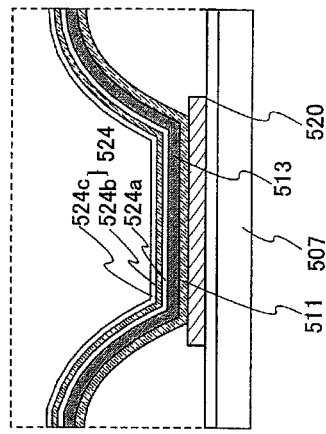

In a light emitting device shown in FIGS. 4A to 4C, a protective film 524 may have a layered structure of an inorganic insulating film and an organic resin film. FIG. 22A shows a configuration in which the protective film 524 shown in FIG. 4B has a layered structure. FIG. 22B shows a configuration in which the protective film 524 shown in FIG. 4C has a layered structure. In FIGS. 22A and 22B, an inorganic insulating film 524a is formed on the electron injection layer 513. An organic resin film 524b and an inorganic insulating film 524c are sequentially stacked over the inorganic insulating film 524a. A substance which may accelerate deterioration of a light emitting element such as moisture or oxygen can be prevented from entering the light emitting element 514 by using silicon nitride, silicon oxynitride, aluminum oxide, aluminum nitride, aluminum nitride oxide, or aluminum silicide oxynitride is used for the inorganic insulating films 524a and 524c. Further, the organic resin film 524b with less internal stress is provided between the inorganic insulating layers 524a and 524c; thus, the protective film 524 can be prevented from being peeled off by stress. For the organic resin film 524b, polyimide, acrylic, polyamide, polyimide amide, benzocyclobutene, or epoxy resin may be used.

Figure 5:
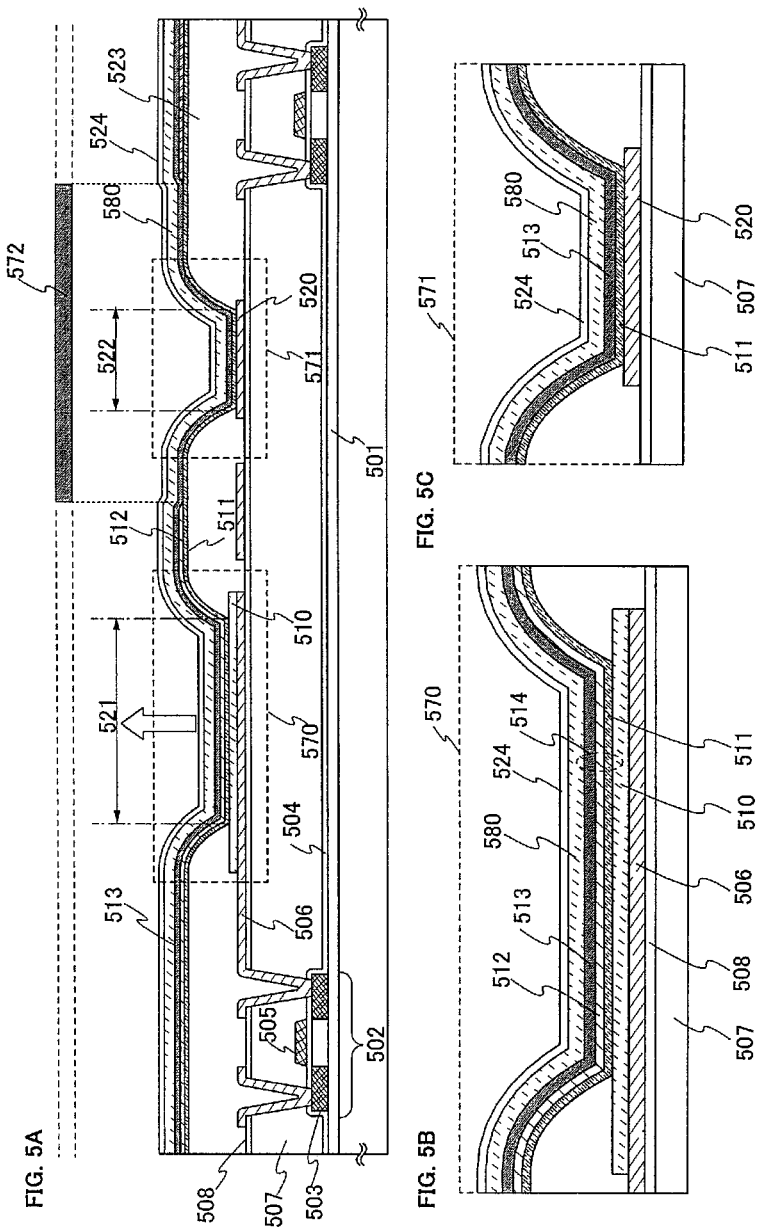
FIGS. 5A to 5C are cross-sectional views of a pixel area in a light emitting device of the invention.

In this embodiment mode, the electron injection layer 513 is covered with the protective film 524 as shown in FIG. 4; however, the invention is not limited thereto. An example of forming a transparent conductive film between the electron injection layer 513 and the protective film 524 in the light emitting device shown in FIGS. 4A to 4C is shown in FIGS. 5A to 5C. Note that, in FIGS. 5A to 5C, the same reference numerals are used to refer to the like components which are already shown in FIGS. 4A to 4C. Reference numeral 580 denotes a transparent conductive film. Even though the resistance of the electron injection layer 513 itself which serves as a counter electrode is increased, the potential drop can be suppressed by forming the transparent conductive film 580 so as to be in contact with the electron injection layer 513.

Figure 24:
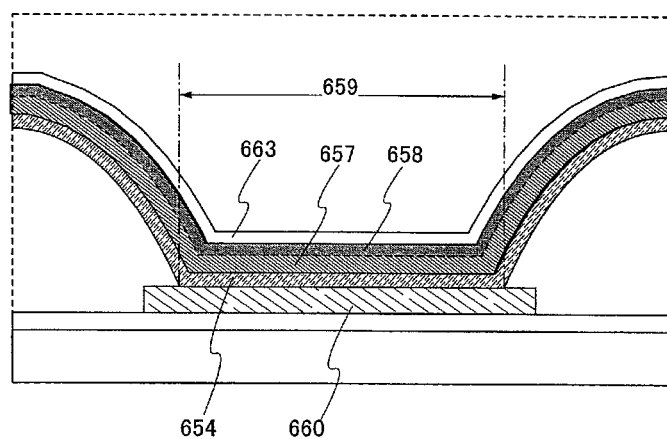
FIG. 24 is a cross-sectional view of a pixel in a light emitting device of the invention.

In a light emitting device shown in FIGS. 4A to 4C, FIGS. 5A to 5C, FIGS. 22A and 22B, and FIGS. 23A and 23B; an electron injection layer is formed with a plurality of layers, and one of alkali metal, alkaline earth metal, and transition metal having the highest density is added into the electron injection layer of the top layer FIG. 24 shows a connection structure between an auxiliary electrode and a hole transport layer in the case of providing two layers of electron injection layers in a light emitting device in FIGS. 4A to 4C. In FIG. 24, reference numeral 659 denotes an opening for connecting a hole transport layer 654 to an auxiliary electrode 660. Two layers of electron injection layers 657 and 658 are formed and stacked sequentially over the hole transport layer 654. Reference numeral 663 denotes a protective film. In FIG. 24, one of alkali metal, alkaline earth metal, and transition metal is added to the electron injection layer 658 formed in the top layer with higher density than in the electron injection layer 657. Electron transporting materials for the electron injection layers 657 and 658 may be the same or different.

EMBODIMENT MODE 5

In this embodiment mode, an example of partially removing a hole injection layer in the light emitting device shown in FIGS. 4A to 4C by plasma etching will be described. FIG. 6A shows a cross-sectional view of a pixel of this embodiment mode. Further, enlarged views of the portions that are enclosed by dashed lines 601 and 602 in FIG. 6A are respectively shown in FIGS. 6B and 6C.

In this embodiment mode, the configuration of a light emitting element is the same as the configuration shown in FIGS. 4A to 4C. Specifically, a part of a pixel electrode 603 is exposed in an opening 605 formed in a second interlayer insulating film 604. A hole injection layer 606, a light emitting layer 607, an electron injection layer 608, and a protective film 613 are stacked sequentially over the pixel electrode 603 so as to cover the opening 605. The protective film 613 is not necessarily provided; however, deterioration of the light emitting element can be reduced by providing the protective film. The portion in the opening 605 where the pixel electrode 603, the hole injection layer 606, the light emitting layer 607, and the electron injection layer 608 overlap is a light emitting element 611.

Further, in the second interlayer insulating film 604, an opening 609 for exposing a part of an auxiliary electrode 610 is formed other than the opening 605. In this embodiment mode, at least a part of the auxiliary electrode 610 is exposed so that the hole injection layer 606 and the light emitting layer 607 do not completely cover up the opening 609. Specifically, the auxiliary electrode 610 can be exposed by selectively etching the hole injection layer 606 and the light emitting layer 607 by plasma etching using a metal mask 612. Alternatively, the light emitting layer 607 may be selectively formed by vapor deposition, and the hole injection layer 606 may be selectively etched by plasma etching.

With the above structure the auxiliary electrode 610 and the electron injection layer 608 serving as a counter electrode can be connected in the opening 609.

In a light emitting device shown in FIGS. 6A to 6C, a protective film 613 may have a layered structure of an inorganic insulating film and an organic resin film. FIG. 23A shows a configuration in which the protective film 613 shown in FIG. 6B has a layered structure. FIG. 23B shows a configuration in which the protective film 613 shown in FIG. 6C has a layered structure. In FIGS. 23A and 23B, an inorganic insulating film 613a is formed on the electron injection layer 608, and an organic resin film 613b and an inorganic insulating film 613c are sequentially stacked over the inorganic insulating film 613a. A substance which may accelerate deterioration of a light emitting element such as moisture or oxygen can be prevented from entering the light emitting element 611 by using silicon nitride, silicon oxynitride, aluminum oxide, aluminum nitride, aluminum nitride oxide, or aluminum silicide oxynitride is used for the inorganic insulating films 613a and 613c. Further, the organic resin film 613b with less internal stress is provided between the inorganic insulating layers 613a and 613c; thus, the protective film 613 can be prevented from being peeled off by stress. For the organic resin film 613b, polyimide, acrylic, polyamide, polyimide amide, benzocyclobutene, or epoxy resin may be used.

Figure 6:
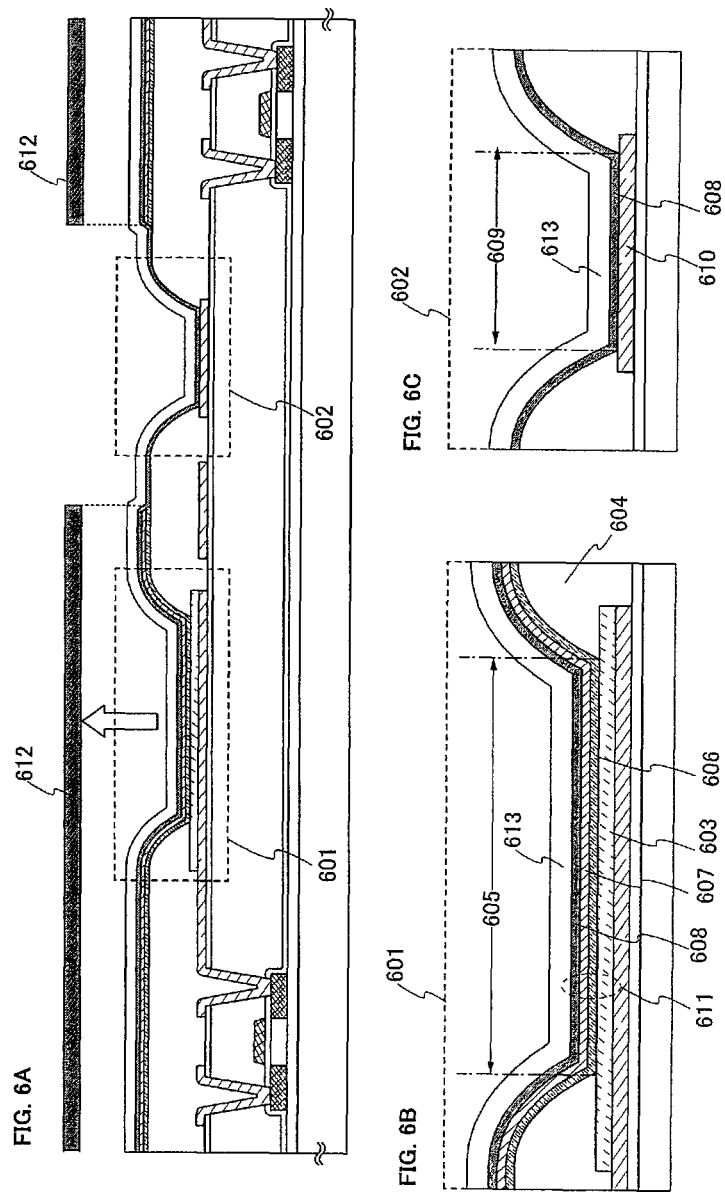
FIGS. 6A to 6C are cross-sectional views of a pixel area in a light emitting device of the invention.

In this embodiment mode, the electron injection layer 608 is covered with the protective film 613 as shown in FIG. 6; however, the invention is not limited thereto. An example of forming a transparent conductive film between the electron injection layer 608 and the protective film 613 in the light emitting device shown in FIGS. 6A to 6C is shown in FIGS. 7A to 7C. Note that, in FIGS. 7A to 7C, the same reference numerals are used to refer to the like components which are already shown in FIGS. 6A to 6C. Reference numeral 614 denotes a transparent conductive film. Even though the resistance of the electron injection layer 608 itself which serves as a counter electrode is increased, the potential drop can be suppressed by forming the transparent conductive film 614 so as to be in contact with the electron injection layer 608.

Figure 7:
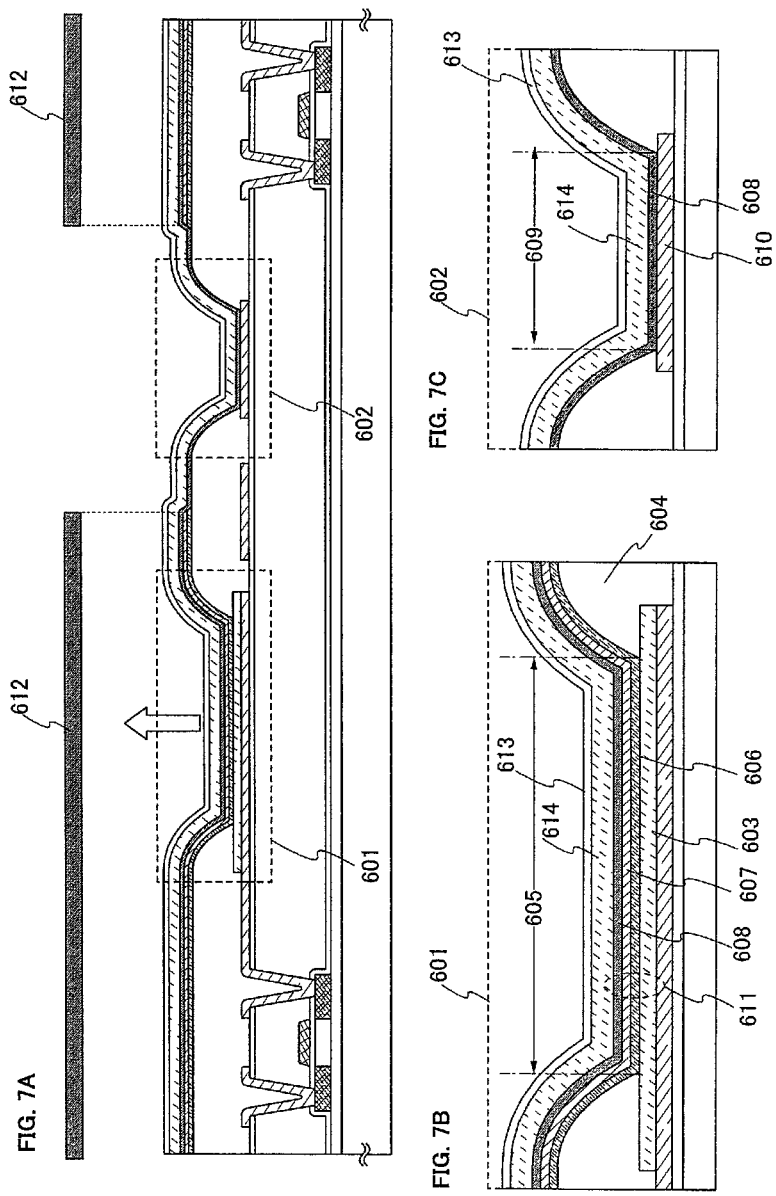
FIGS. 7A to 7C are cross-sectional views of a pixel area in a light emitting device of the invention.
Figure 8:
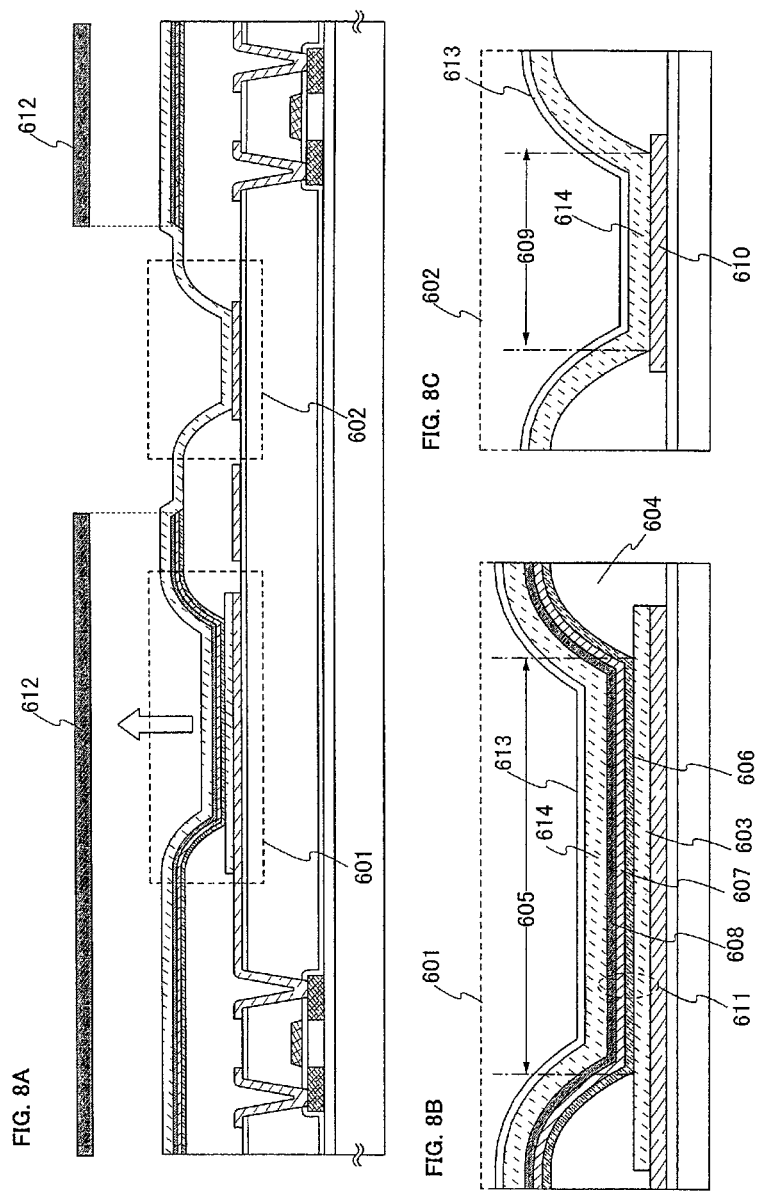
FIGS. 8A to 8C are cross-sectional views of a pixel area in a light emitting device of the invention.

Further, the opening 609 in a light emitting device shown in FIG. 7 is not necessarily covered with the electron injection layer 608. An example of forming a transparent conductive film between the auxiliary electrode 610 and the protective film 613 in the light emitting device shown in FIGS. 7A to 7C is shown in FIGS. 8A to 8C. Note that, in FIG. 8, the same reference numerals are used to refer to the like components which are already shown in FIGS. 7A to 7C. Reference numeral 614 denotes a transparent conductive film. As shown in FIGS. 8A to 8C, the transparent conductive film 614 and the auxiliary electrode 610 are connected directly in the opening 609 by not covering the opening 609 with the electron injection layer 608.

In a light emitting device shown in FIGS. 6A to 6C, FIGS. 7A to 7C, and FIGS. 8A to 8C, an electron injection layer is formed with a plurality of layers, and one of alkali metal, alkaline earth metal, and transition metal having the highest density is added into an electron injection layer of the top layer as the light emitting device shown in FIG. 24.

EMBODIMENT MODE 6

In this embodiment mode, connection between an auxiliary electrode and each element provided in a pixel will be described.

Figure 12:
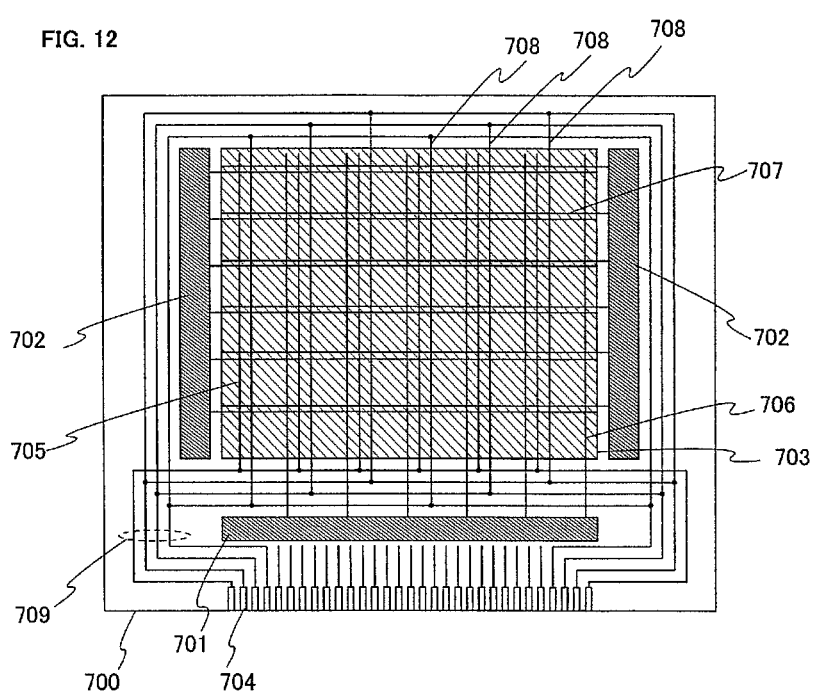
FIG. 12 is a figure showing a configuration of a light emitting device of the invention.

A top view of a panel included in a light emitting device of the invention is shown in FIG. 12. Reference numeral 700 denotes a substrate in FIG. 12A. A signal line driver circuit 701, a scan line driver circuit 702, and a pixel area 703 are provided over the substrate 700. An auxiliary electrode 705, a signal line 706, a scan line 707, and a power line 708 are provided in the pixel area 703. A video signal is given to the signal line 706 from the signal line driver circuit 701, and the potential of the scan line 707 is controlled by the scan line driver circuit 702.

A plurality of connection terminals 704 are provided at the end portion of the substrate 700, and various signals and potentials are supplied to the panel via the connection terminals 704. The potential given to each of the auxiliary electrode 705 and the power line 708 is given from the connection terminals 704 also via a leader wiring 709.

Figure 13A:
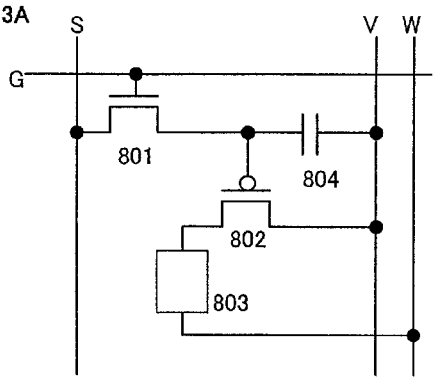
FIGS. 13A and 13B are schematic diagrams of a pixel area in a light emitting device of the invention.

A schematic diagram of a pixel provided in the pixel area 703 is shown in FIG. 13A. Further, a part of the pixel area 703 in which the pixels shown in FIG. 13A are arranged in matrix is shown in FIG. 13B.

A pixel shown in FIG. 13A includes two transistors of 801 and 802, a light emitting element 803, and a capacitor element 804. Further, the pixel includes a signal line S, a scan line G, a power line V, and an auxiliary electrode W. Reference numeral 801 denotes a transistor (a switching transistor) for controlling input of a video signal to the pixel, and reference numeral 802 denotes a transistor (a driver transistor) for controlling current supplied to the light emitting element 803. Note that the capacitor element 804 has a function to keep the potential of the gate electrode of the driver transistor 802 when the switching transistor 801 is off. The capacitor element is not necessarily provided.

Specifically, as for the switching transistor 801, the gate electrode is connected to the scan line G; one of the source and the drain is connected to the signal line S; and the other is connected to the gate electrode of the driver transistor 802. As for the driver transistor 802, the source is connected to the power line V, and the drain is connected to the pixel electrode of the light emitting element 803. Further, the counter electrode of the light emitting element 803 is connected to the auxiliary electrode W. One of the two electrodes of the capacitor element 804 is connected to the gate of the driver transistor 802, and the other is connected to the power line V.

Figure 13B:
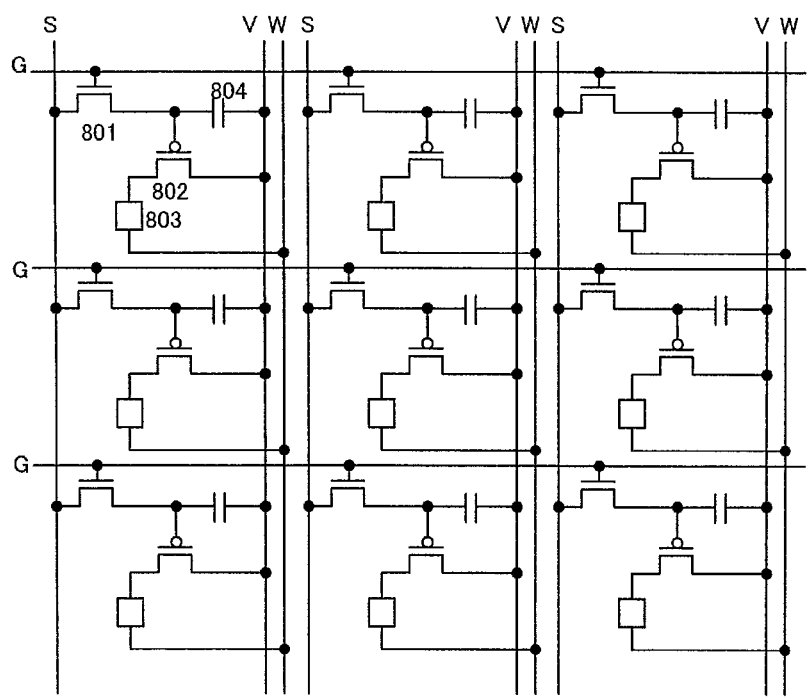

In FIG. 13B, an example of sharing the auxiliary electrode W in pixels sharing the signal line S and the power line V is shown. In the case of FIG. 13B, the auxiliary electrode W can be formed from one conductive film from which the signal line S and the power line V are formed.

Further, an example of the auxiliary electrode W in pixels sharing the scan line G is shown in FIG. 14. In the case of FIG. 14, the auxiliary electrode W can be formed from one conductive film from which the scan line G is formed.

Note that the pixel shown in FIG. 13A only shows one embodiment of a pixel included in a light emitting device of the invention, and a light emitting device of the invention is not limited to the pixel shown in this embodiment mode.

EMBODIMENT 1

In this embodiment, a lay out of a leader wiring, an auxiliary electrode, a signal line, and a power line will be described.

Figure 15:
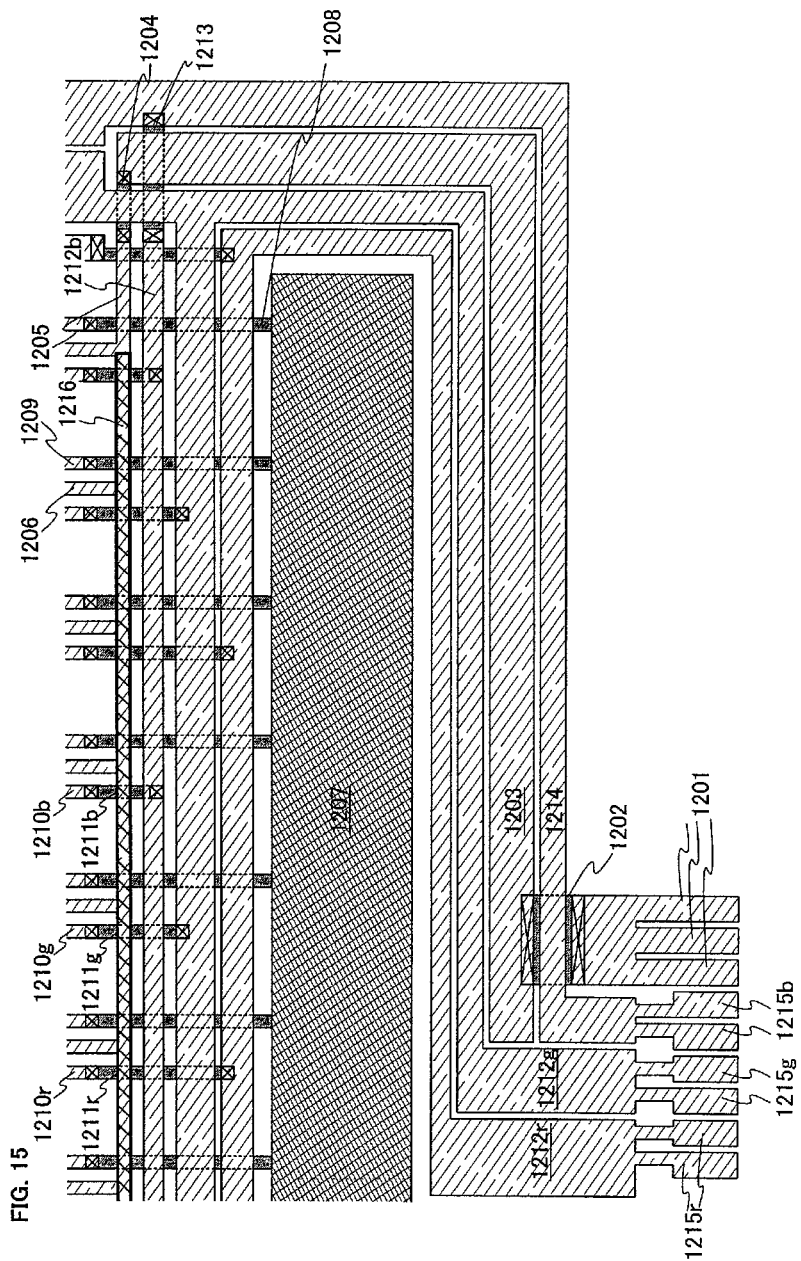
FIG. 15 is a figure showing a layout of leader wiring and connection wiring in a light emitting device of the invention.

A top view of a portion where a leader wiring and an auxiliary electrode are connected is shown in FIG. 15. Reference numeral 1201 denotes connection terminals, and the connection terminal is connected to a wiring 1203 via a wiring 1202. Further, the wiring 1203 is connected to a wiring 1205 via a wiring 1204. The wiring 1205 is connected to an auxiliary electrode 1206; more specifically, the wiring 1205 is formed with a conductive film shared by the auxiliary electrode 1206. Accordingly, in the case of FIG. 15, the leader wiring which connect the connection terminals 1201 and the auxiliary electrode 1206 are equivalent to the wirings 1202, 1203, 1204, and 1205.

Reference numeral 1207 denotes a signal line driver circuit, and the signal line driver circuit supplies a video signal to a signal line 1209 via a wiring 1208. Power lines 1210r, 1210g, and 1210b corresponding to each color are respectively connected to wirings 1212r, 1212g, and 1212b via wirings 1211r, 1211g, and 1211b. The wiring 1212b is further connected to a wiring 1214 via a wiring 1213. Wirings 1212r, 1212g, and 1214 are respectively connected to connection terminals 1215r, 1215g, and 1215b.

Reference numeral 1216 denotes an opening formed in a second interlayer insulating film, and in the opening 1216, the wiring 1205 and a counter electrode (not shown) are connected directly or electrically.

EMBODIMENT 2

In this embodiment, variations on a pixel of the invention will be described.

Figure 16A:
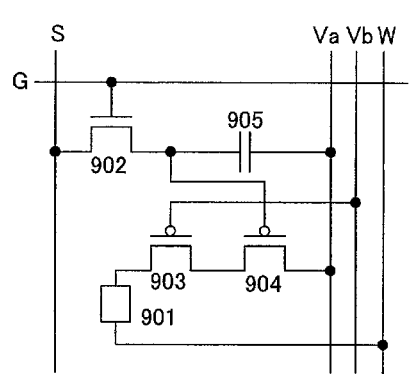
FIGS. 16A to 16D are schematic diagrams of a pixel in a light emitting device of the invention.

FIG. 16A shows an example of a pixel included in the light emitting device of the invention. The pixel shown in FIG. 16A has a light emitting element 901, a transistor used as a switching element for controlling a video signal inputted to the pixel, a driver transistor 903 for controlling a current value supplied to the light emitting element 901, and a current control transistor 904 for selecting whether current is supplied to the light emitting element 901 or not. The pixel may also have a capacitor element 905 for holding a potential of a gate of the transistor 904 as shown in this embodiment mode.

The switching transistor 902 may be either n-type or p-type. The driver transistor 903 and the current control transistor 904 may be either n-type or p-type, on condition that both of them has the same conductivity type. The driver transistor 903 is operated in a saturation region, and the current control transistor 904 is operated in a linear region. Either an enhancement mode transistor or a depletion mode transistor may be used for the driver transistor 903.

The channel length L of the driver transistor 903 is preferably longer than the channel width W thereof, and the channel length L of the current control transistor 904 is preferably equal to or shorter than the channel width W thereof. More preferably, the ratio of the length L to the width W of the driver transistor 903 is five or more. With the above structure, variations in luminance of the light emitting element 901 among pixels due to variations in characteristics of the driver transistor 903 can be suppressed. Furthermore, assuming that L of the driver transistor is L1 and W thereof is W1, and L of the current control transistor is L2 and W thereof is W2; when L1/W1:L2/W2=X:1 is satisfied, X is desirably in the range from 5 to 6000. For example, it is desirable that L1/W1=500 μm/3 μm, and L2/W2=3 μm/100 μm.

The gate electrode of the switching transistor 902 is connected to a scan line G. Either the source or drain of the switching transistor 902 is connected to a signal line S, and the other is connected to the gate of the current control transistor 904. The gate electrode of the driver transistor 903 is connected to a second power line Vb. The driver transistor 903 and the current control transistor 904 are respectively connected to the first power line Va and the light emitting element 901 so that current supplied from the first power line Va is supplied to the light emitting element 901 as a drain current of the driver transistor 903 and of the current control transistor 904. In this embodiment the source of the current control transistor 904 is connected to the first power line Va and the drain of the driver transistor 903 is connected to a pixel electrode of the light emitting element 901.

The source of the driver transistor 903 may be connected to the first power line Va, and the drain of the current control transistor 904 may be connected to the pixel electrode of the light emitting element 901.

The light emitting element 901 has an anode, a cathode, and an electroluminescent layer interposed between the anode and the cathode. As shown in FIG. 16A, when the anode of the light emitting element 901 is connected to the driver transistor 903, the anode serves as a pixel electrode and the cathode serves as a counter electrode. Potential difference is given between the first power line Va and the counter electrode so that a forward bias is applied between the anode and the cathode of the light emitting element 901. The counter electrode is connected to an auxiliary electrode W.

One of the two electrodes of the capacitor element 905 is connected to the first power line Va, and the other is connected to the gate electrode of the current control transistor 904. The capacitor element 905 is disposed so as to hold a potential difference between the electrodes of the capacitor element 905 when the switching transistor 902 is not selected (in OFF state). It is to be noted that although FIG. 16A shows a configuration in which the capacitor element 905 is provided, the invention is not limited thereto and another configuration without the capacitor element 905 may be employed instead.

In FIG. 16A, each of the driver transistor 903 and the current control transistor 904 is p-channel type, and the drain of the driver transistor 903 is connected to the anode of the light emitting element 901. On the contrary, in the case where each of the driver transistor 903 and the current control transistor 904 is n-channel type, the source of the driver transistor 903 is connected to the cathode of the light emitting element 901. In this case, the cathode of the light emitting element 901 serves as a pixel electrode and the anode thereof serves as a counter electrode.

Figure 16B:
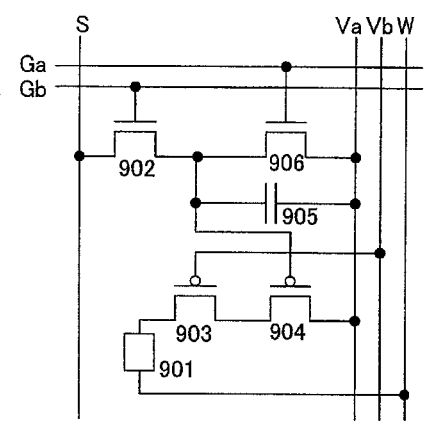

In FIG. 16B, a schematic diagram of a pixel provided with a transistor (erasing transistor) 906 which forcibly turns off the current control transistor 904 in a pixel shown in FIG. 16A is shown. In FIG. 16B, the same reference numerals are referred to the like elements already described in FIG. 16A. Note that a first scan line is denoted by Ga, and a second scan line is denoted by Gb thereby distinguishing between the two scan lines. A gate electrode of the erasing transistor 906 is connected to the first scan line Ga, and one of a source and a drain thereof is connected to a gate electrode of the current control transistor 904, and the other is connected to the first power line Va. The erasing transistor 906 may be either n-type or p-type.

Figure 16C:
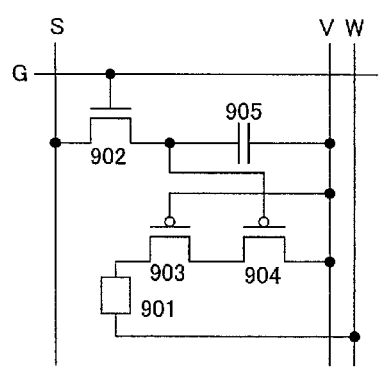

In FIG. 16C, a schematic diagram of a pixel in which a source of the current control transistor 904 together with the gate electrode of the driver transistor 903 are connected to one power line V in a pixel shown in FIG. 16A is shown. In FIG. 16C, the same reference numerals denote the like elements already described in FIG. 16A. As shown in FIG. 16C, when the source of the current control transistor 904 and the gate of the driver transistor 903 are connected to one common power line V, a depletion mode transistor is used for the driver transistor 903, and a normal enhancement mode transistor is used for transistors other than the driver transistor 903.

Figure 16D:
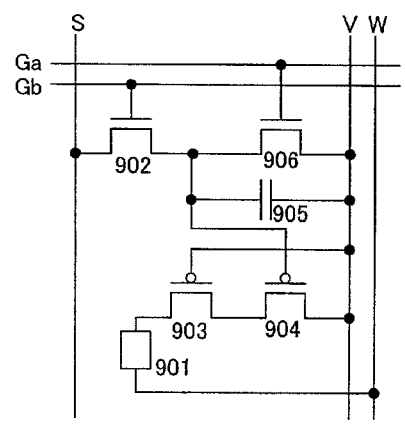

In FIG. 16D, a schematic diagram of a pixel provided with a transistor (erasing transistor) 906 which forcibly turns off the current control transistor 904 in a pixel shown in FIG. 16C is shown. In FIG. 16D, the same reference numerals denote the like elements already described in FIGS. 16A to 16C. A gate electrode of the erasing transistor 906 is connected to the first scan line Ga, and one of a source and a drain thereof is connected to a gate electrode of the current control transistor 904, and the other is connected to the power line V. The erasing transistor 906 may be either n-type or p-type.

Figure 17A:
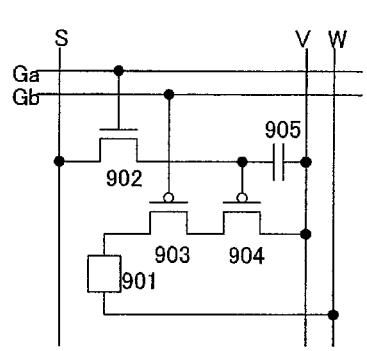
FIGS. 17A to 17D are schematic diagrams of a pixel in a light emitting device of the invention.

In FIG. 17A, a schematic diagram of a pixel in which a gate electrode of the driver transistor 904 is connected to the second scan line Gb in a pixel shown in FIG. 16A is shown. In FIG. 17A, the same reference numerals denote the like elements already described in FIG. 16A. As shown in FIG. 17A, the light emission of a light emitting element 901 can be forcibly finished regardless of information included in a video signal by changing potential given to the gate electrode of a driver transistor 903. Either an enhancement mode transistor or a depletion mode transistor may be used for the driver transistor 903.

Figure 17B:
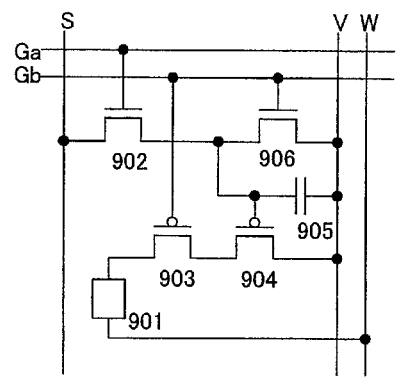

In FIG. 17B, a schematic diagram of a pixel provided with a transistor (erasing transistor) 906 which forcibly turns off the current control transistor 904 in a pixel shown in FIG. 17A is shown. In FIG. 17B, the same reference numerals denote the like elements already described in FIGS. 16A to 16D and FIG. 17A. A gate electrode of the erasing transistor 906 is connected to the second scan line Gb, and one of a source and a drain thereof is connected to a gate electrode of the current control transistor 904, and the other is connected to the power line V. The erasing transistor 906 may be either n-type or p-type.

Figure 17C:
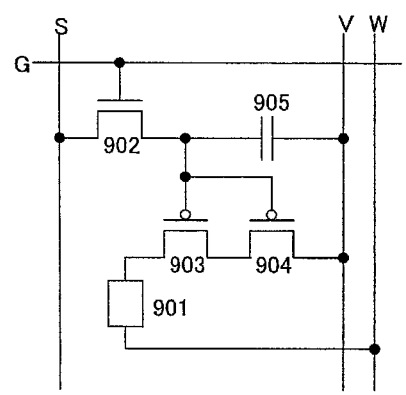

In FIG. 17C, a schematic diagram of a pixel in which the gate electrode of the driver transistor 903 and the gate electrode of the current control transistor 904 are connected in a pixel shown in FIG. 16A is shown. In FIG. 17C, the same reference numerals denote the like elements already described in FIG. 16A. As shown in FIG. 17C, when the gate electrodes of the current control transistor 904 and the driver transistor 903 are connected, a depletion mode transistor is used for the driver transistor 903, and a normal enhancement mode transistor is used for transistors other than the driver transistor 903.

Figure 17D:
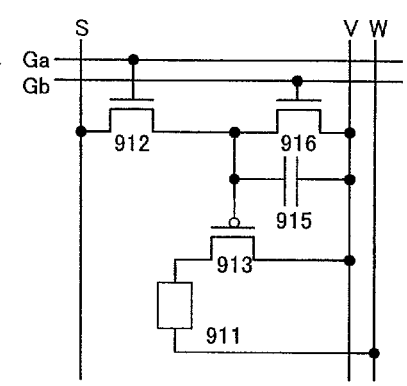

A structure of the pixel in which a current control transistor is not provided is shown in FIG. 17D. In FIG. 17D, reference numeral 911 denotes a light emitting element, 912 denotes a switching transistor, 913 denotes a driver transistor, 915 denotes a capacitor element, and 916 denotes an erasing transistor. As for the switching transistor 912, the gate electrode is connected to the first scan line Ga; one of the source and the drain is connected to the signal line S; and the other is connected to the gate electrode of the driver transistor 913. As for the driver transistor 913, the source is connected to the power line V, and the drain is connected to the pixel electrode of the light emitting element 911. Further, the counter electrode of the light emitting element 911 is connected to the auxiliary electrode W. A gate electrode of the erasing transistor 916 is connected to the second scan line Gb, and one of a source and a drain thereof is connected to the gate electrode of the driver transistor 913, and the other is connected to the power line V.

Note that, a configuration of a pixel included in a light emitting device of the invention is not limited to the configuration shown in this embodiment.

EMBODIMENT 3

Figure 18:
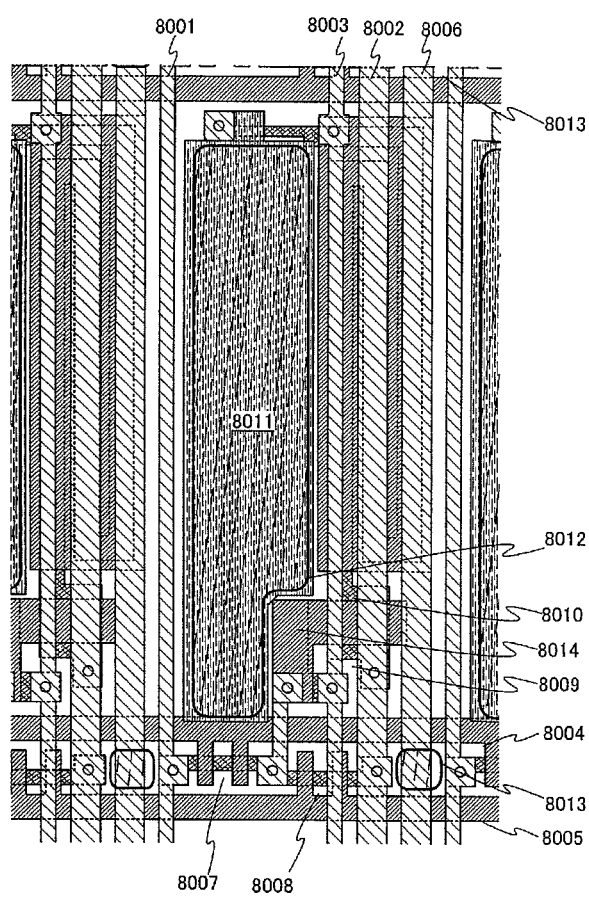
FIG. 18 is a top view of a pixel in a light emitting device of the invention.

In this embodiment, a mode of a pixel shown in FIG. 16A will be described. FIG. 18 shows a top view of a pixel of this embodiment.

Reference numeral 8001 denotes a signal line, 8002 denotes a first power line, 8003 denotes a second power line, 8004 denotes a first scan line, 8005 denotes a second scan line, and 8006 denotes an auxiliary electrode. In this embodiment, the signal line 8001, the first power line 8002, the second power line 8003, and the auxiliary electrode 8006 are formed from one conductive film, and the first scan line 8004 and the second scan line 8005 are formed from one conductive film. Reference numeral 8007 denotes a switching transistor, and a part of the first scan line 8004 serves as its gate electrode. Reference numeral 8008 denotes an erasing transistor, and a part of the second scan line 8005 serves as its gate electrode. Reference numeral 8009 denotes a current control transistor, and 8010 denotes a driver transistor. An active layer of the driver transistor 8010 snakes so that the L/W becomes larger than that of the current control transistor 8009. Reference numeral 8011 denotes a pixel electrode, and it is overlapped with an electroluminescent layer and a counter electrode (neither of them is shown) in an opening 8012. The auxiliary electrode 8006 is connected to the counter electrode in an opening 8013. Reference numeral 8014 denotes a capacitor element, and it is formed from a gate insulating film provided between the second power line 8003 and the current control transistor 8009.

Note that the top view shown in this embodiment is only an example, and the invention is, needless to say, not limited to this.

EMBODIMENT 4

A transistor used in the invention may be formed from amorphous silicon. When forming a transistor by using amorphous silicon, the fabrication method can be simplified since a crystallization process is not necessary, which contributes to the cost reduction. Note that, as for a transistor formed from amorphous silicon, a n-channel transistor is more suitable for a pixel of a light emitting device than a p-channel transistor as an n-channel transistor has higher mobility. In this embodiment, a cross-sectional structure of a pixel using an n-channel driver transistor will be described.

Figure 19A:
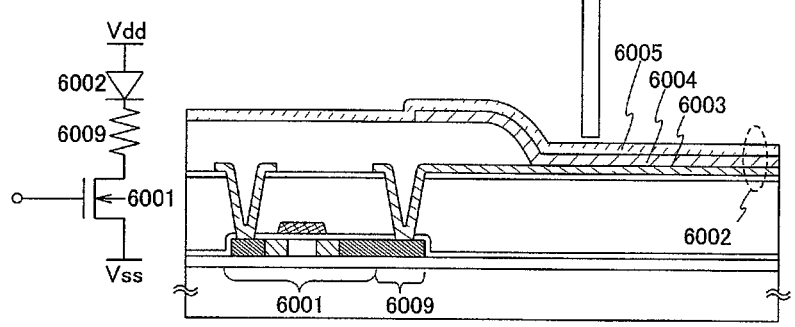
FIGS. 19A and 19B are cross-sectional views of a pixel in a light emitting device of the invention.

FIG. 19A shows a cross-sectional view of a pixel in which a driver transistor 6001 is n-channel type and light emitted from a light emitting element 6002 is transmitted to the side of an anode 6005. In FIG. 19A, a cathode 6003 of the light emitting element 6002 is electrically connected to the driver transistor 6001, and an electroluminescent layer 6004 and an anode 6005 are sequentially stacked over the cathode 6003. Any known material can be used for the cathode 6003 as long as it is a conductive film having light reflectivity and a small work function. For example, Ca, Al, CaF, MgAa, AlLi, or the like is desirably used. The electroluminescent layer 6004 may have a single layer or a plurality of layers. When it includes a plurality of layers, an electron injection layer, an electron transport layer, a light emitting layer, a hole transport layer, and a hole injection layer are sequentially stacked over the cathode 6003. Note that all the above layers are not necessarily provided. The anode 6005 may be formed from a transparent conductive film which transmits light, such as ITO or one in which zinc oxide is mixed to indium oxide at a concentration of 2% to 20%.

The portion where the cathode 6003, the electroluminescent layer 6004, and the anode 6005 overlap is equivalent to the light emitting element 6002. In the case of the pixel shown in FIG. 19A, light emitted from the light emitting element 6002 is transmitted to the side of the anode 6005 as shown by an outline arrow.

A part of an active layer of the driver transistor 6001 serves as a resistor 6009.

Figure 19B:
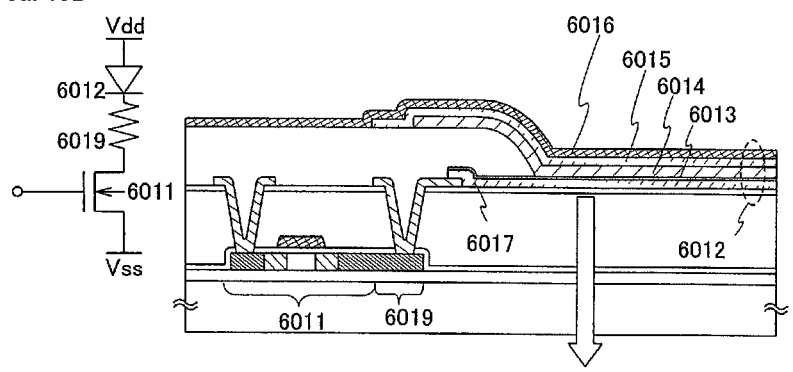

FIG. 19B shows a cross-sectional view of a pixel in which a driver transistor 6011 is n-channel type and light emitted from a light emitting element 6012 is transmitted to the side of a cathode 6013. In FIG. 19B, the cathode 6013 of the light emitting element 6012 is formed over a transparent conductive film 6017 which is electrically connected to a drain of the driver transistor 6011, and an electroluminescent layer 6014 and an anode 6015 are sequentially stacked over the cathode 6013. A shielding film 6016 which reflects or shuts off light is formed so as to cover the anode 6015. A known material can be used for the cathode 6013 as long as it is a conductive film having a small work function as in FIG. 19A. The film is formed to have a thickness thin enough to transmit light. For example, Al having a thickness of 20 nm can be used for the cathode 6013. The electroluminescent layer 6014 may have a single layer or multiple layers as shown in FIG. 19A. The anode 6015 may be formed from a transparent conductive film although it is not required to transmit light. For the shielding film 6016, a light-reflective metal can be used for example; however, the invention is not limited to a metal film. For example, a resin added with a black pigment or the like can be used.

The portion where the cathode 6013, the electroluminescent layer 6014, and the anode 6015 overlap is equivalent to the light emitting element 6012. In the case of the pixel shown in FIG. 19B, light emitted from the light emitting element 6012 is transmitted to the side of the cathode 6013 as shown by an outline arrow.

A part of an active layer of the driver transistor 6011 serves as a resistor 6019.

Note that an example in which the driver transistor is electrically connected to the light emitting element in this embodiment; however, a current control transistor may be interposed between the driver transistor and the light emitting element.

EMBODIMENT 5

In this embodiment, a cross-sectional view of a pixel in which a driver transistor is p-channel type.

Figure 20A:
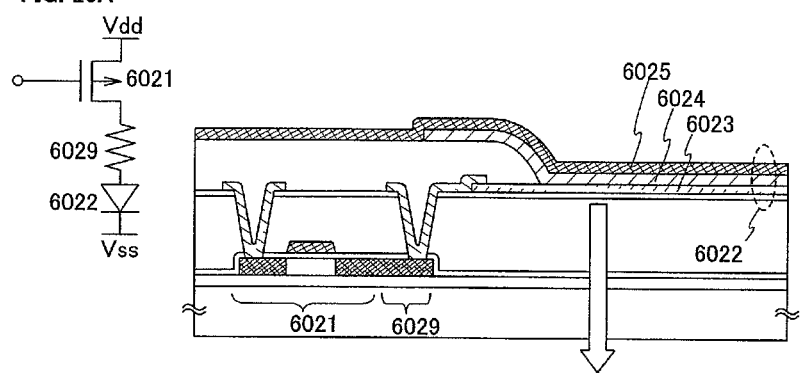
FIGS. 20A and 20B are cross-sectional views of a pixel in a light emitting device of the invention.

FIG. 20A shows a cross-sectional view of a pixel in which a driver transistor 6021 is p-channel type and light emitted from a light emitting element 6022 is transmitted to the side of an anode 6023. In FIG. 20A, an anode 6023 of the light emitting element 6022 is electrically connected to the driver transistor 6021, and an electeoluminescent layer 6024 and a cathode 6025 are sequentially stacked over the anode 6023. Any known material can be used for the cathode 6025 as long as it is a conductive film having light reflectivity and a small work function. For example, Ca, Al, CaF, MgAg, AlLi, or the like is desirably used. The electroluminescent layer 6024 may have a single layer or a plurality of layers. When it includes a plurality of layers, a hole injection layer, a hole transport layer, a light emitting layer, an electron transport layer, and an electron injection layer are sequentially stacked over the anode 6023. Note that all the above layers are not necessarily provided. The anode 6023 may be formed from a transparent conductive film which transmits light, such as ITO or one in which zinc oxide is mixed to indium oxide at a concentration of 2% to 20%.

The portion where the anode 6023, the electroluminescent layer 6024, and the anode 6025 overlap is equivalent to the light emitting element 6022. In the case of the pixel shown in FIG. 20A, light emitted from the light emitting element 6022 is transmitted to the side of the anode 6023 as shown by an outline arrow.

A part of an active layer of the driver transistor 6021 serves as a resistor 6029.

Figure 20B:
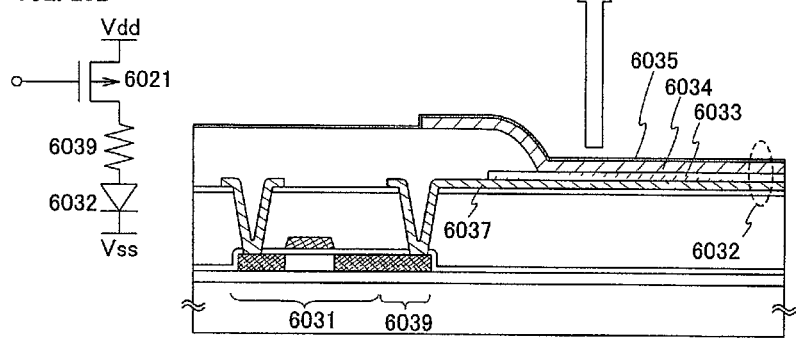

FIG. 20B shows a cross-sectional view of a pixel in which a driver transistor 6031 is p-channel type and light emitted from a light emitting element 6032 is transmitted to the side of a cathode 6035. In FIG. 20B, the anode 6033 of the light emitting element 6032 is formed over a wiring 6037 which is electrically connected to a drain of the driver transistor 6031, and an electroluminescent layer 6034 and the cathode 6035 are sequentially stacked over the anode 6033. With the above structure, although light transmits through the anode 6033, the light is reflected by the wiring 6037. A known material can be used for the anode 6035 as long as it is a conductive film having a small work function as in FIG. 20A. The film is formed to have a thickness that transmits light. For example, Al having a thickness of 20 nm can be used for the cathode 6035. The electroluminescent layer 6034 may have a single layer or multiple layers as shown in FIG. 20A. The anode 6033 may be formed with a transparent conductive film although it is not required to transmit light. For the wiring 6037, a light-reflective metal can be used.

The portion where the anode 6033, the electroluminescent layer 6034, and the cathode 6035 overlap is equivalent to the light emitting element 6032. In the case of the pixel shown in FIG. 20B, light emitted from the light emitting element 6032 is transmitted to the side of the cathode 6035 as shown by an outline arrow.

A part of an active layer of the driver transistor 6031 serves as a resistor 6039.

Note that an example in which the driver transistor is electrically connected to the light emitting element in this embodiment; however, a current control transistor may be interposed between the driver transistor and the light emitting element.

EMBODIMENT 6

Figure 21:
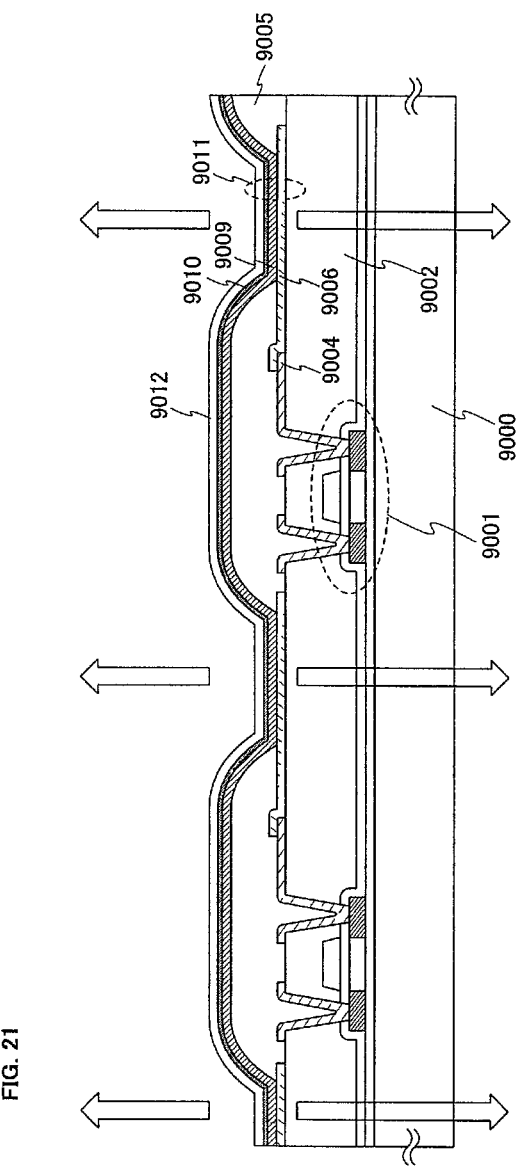
FIG. 21 is a cross-sectional view of a pixel in a light emitting device of the invention.

A cross-sectional structure of a pixel of a dual emission light emitting device of the invention will be described with reference to FIG. 21. A driver transistor 9001 formed over a substrate 9000 is shown in FIG. 21. The driver transistor 9001 is covered with a first interlayer insulating film 9002, and a wiring 9004 which is electrically connected to the drain of the driver transistor 9001 is formed over the first interlayer insulating film 9002 through a contact hole.

The wiring 9004 is connected to a pixel electrode 9006. A second interlayer insulating film 9005 is formed over the first interlayer insulating film 9002 so as to cover the wiring 9004 and a part of the pixel electrode 9006. Each of the first interlayer insulating film 9002 and the second interlayer insulating film 9005 may be formed with a single layer or a plurality of layers of silicon oxide, silicon nitride, or silicon oxynitride formed by plasma CVD or spattering. A film in which a silicon oxynitride film having a higher mole fraction of oxygen than nitrogen is stacked over a silicon oxynitride film having a higher mole fraction of nitrogen than oxygen may be used for the first interlayer insulating film 9002 or the second interlayer film 9005. Alternatively, an organic resin film or an organic polysiloxane may be used for the first interlayer insulating film 9002 or the second interlayer film 9005.

The second interlayer insulating film 9005 has an opening. A light emitting element 9011 is formed by overlapping the pixel electrode 9006, an electroluminescent layer 9009, and a cathode 9010 in the opening. In this embodiment, a transparent conductive film is formed so as to cover the cathode 9010.

The electroluminescent layer 7009 has a single light emitting layer or multiple layers including a light emitting layer Further, a protective film may be formed over a transparent conductive film 9012. In this case, the protective film uses a film which hardly transmits a substance which may accelerate deterioration of a light emitting element such as moisture or oxygen compared with other insulating films. Typically, a DLC film, a carbon nitride film, a silicon nitride film formed by RF sputtering, or the like is desirably used for the protective film. Further, a laminate of the film which hardly transmits substances such as moisture and oxygen, and a film which transmits substances such as moisture and oxygen easily compared with the above film may also be used for the protective film.

The pixel electrode 9006 can use a transparent conductive film. Not only ITO, IZO, or ITSO but also a film in which zinc (ZnO) oxide is mixed with indium oxide by 2% to 20% may be used as a transparent conductive film. In FIG. 21, ITO is used for the pixel electrode 9006. The pixel electrode 9006 may be polished by CMP method or by cleaning with porous body of polyvinyl alcohol so that the surface of the pixel electrode 9006 is made flat. Furthermore, the surface of the pixel electrode 9006 may be irradiated with ultraviolet ray or may be treated with oxygen plasma after the CMP method.

The cathode 9010 is formed thin enough to transmit light (preferably, 5 nm to 30 nm), and may be formed of any one of known conductive films with a small work function, preferably using a material such as Ca, Al, CaF, MgAg, and AlLi. Note that, in order to obtain light from the cathode, ITO whose work function is made smaller by adding Li may be used instead of reducing the thickness of the cathode. In the invention, any structure of the light emitting element may be adopted as long as light is released from both sides of an anode and a cathode.

In practical steps, when the pixel has been completed to the stage shown in FIG. 21, it is preferable to perform packaging (sealing) with a protective film (a laminated film, a UV curable resin film, or the like) or a transparent cover material which has high airtightness with a little degassing thereby avoiding exposure to the outside air. On this occasion, if the inside of the cover material is filled with an inert atmosphere and a hygroscopic material (e.g., barium oxide) is provided inside, the reliability of OLED is improved. Further, in the invention, a color filter may be provided for the cover material.

Note that the invention is not limited to the aforementioned fabrication method, and other known methods can be employed.

EMBODIMENT 7

Figures 25A, 25B:
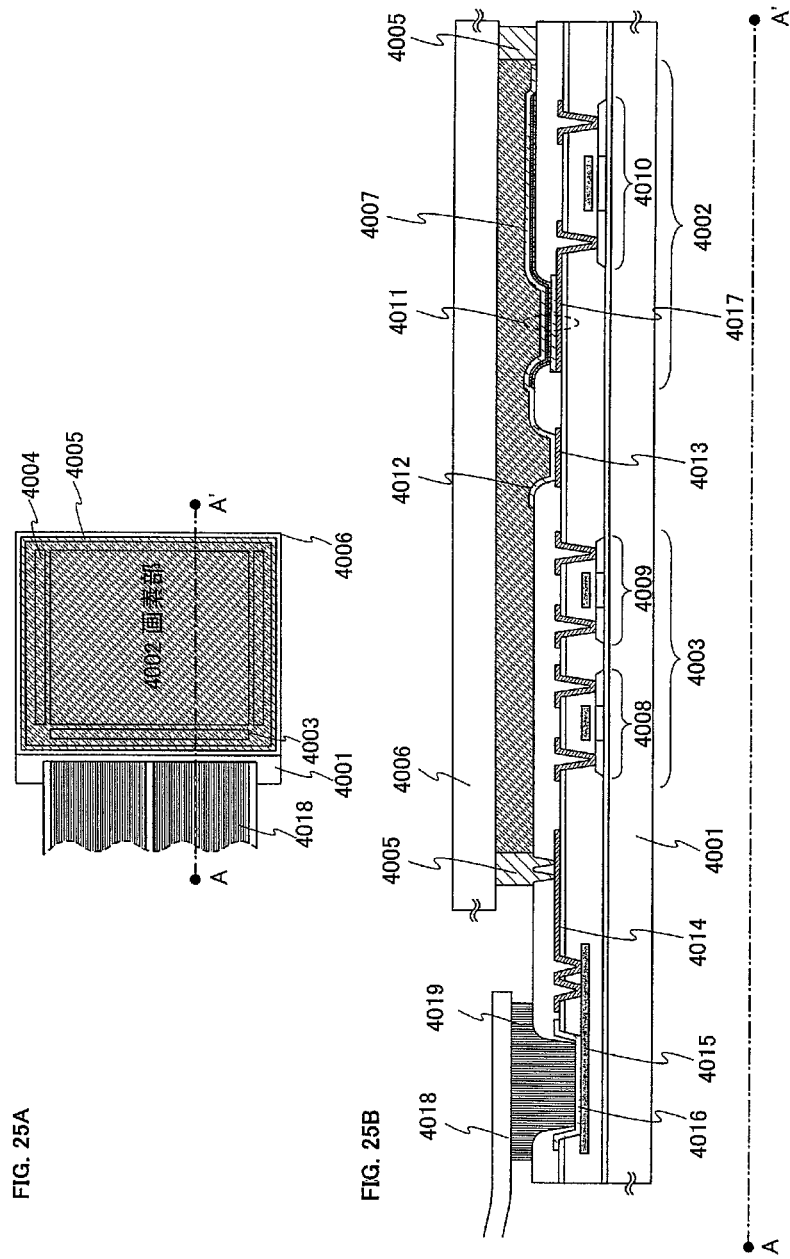
FIGS. 25A and 25B are a top view and a cross-sectional view of a light emitting device of the invention.

In this embodiment, the appearance of a panel equivalent to an example of a light emitting device of the invention will be described with reference to FIGS. 25A and 25B. FIG. 25A is a top view of a panel in which a transistor and a light emitting element formed over a first substrate are sealed between the first substrate and a second substrate with the use of a sealing material. FIG. 25B is a sectional view taken along line A-A' in FIG. 25A.

A sealing material 4005 is provided so as to surround a pixel area 4002, a signal line driver circuit 4003, and a scan line driver circuit 4004 provided over a first substrate 4001. A second substrate 4006 provided over the pixel area 4002, the signal line driver circuit 4003, and the scan line driver circuit 4004. Thus, the pixel area 4002, the signal line driver circuit 4003, and the scan line driver circuit 4004 together with a filler material 4007 are sealed by the first substrate 4001, the sealing material 4005, and the second substrate 4006.

The pixel area 4002, the signal line driver circuit 4003, and the scan line driver circuit 4004 provided over the first substrate 4001 have a plurality of transistors, and transistors 4008 and 4009 included in the signal line driver circuit 4003 and a driver transistor 4010 included in the pixel area 4002 are shown in FIG. 25B.

Further, reference numeral 4011 denotes a light emitting element, and the pixel electrode 4011 included in the light emitting element is electrically connected to the drain of the driver transistor 4010 via the wiring 4017. In this embodiment, a counter electrode of the light emitting element 4011 and a transparent conductive film 4012 are connected electrically, and the transparent conductive film 4012 is connected to an auxiliary electrode 4013 electrically. The auxiliary electrode 4013 is electrically connected to a connection terminal 4016 via leader wirings 4014 and 4015, although this configuration is not shown in the cross-sectional view of FIG. 25B.

In this embodiment, a connection terminal 4016 is formed from a conductive film of a pixel electrode included in the light emitting element 4011. The leader wiring 4014 is formed from a conductive film forming the wiring 4017. Further, the leader wiring 4015 is formed from a conductive film also forming the gate electrode included in each of the driver transistor 4010 and the transistors 4008 and 4009.

The connection terminal 4016 is electrically connected to a terminal of a FPC 4018 via an anisotropic conductive film 4019.

Glass, metal (typically, stainless), ceramic, or plastic may be used for the first substrate 4001 and the second substrate 4006. As the plastic, an FRP (fiberglass-reinforced plastics) plate, a PVF (polyvinyl fluoride) film, a Mylar film, a polyester film, or an acrylic resin film may be used. Further, a sheet with a structure in which an aluminum foil is sandwiched between PVF films or Mylar films may also be used.

However, the second substrate that is located in a side where the light from the light emitting element 4011 is released is required to be transparent. In that case, a transparent material such as a glass plate, a plastic plate, a polyester film or an acrylic film is used.

Further, in addition to an inert gas such as nitrogen or argon, a UV curable resin or a thermosetting resin may be used as the filler material 4007, so that PVC (polyvinyl chloride), acrylic, polyimide, epoxy resin, silicon resin, PVB (polyvinyl butyral) or EVA (ethylene vinyl acetate) may be used. In this embodiment, nitrogen is used for the filler material.

A hygroscopic material (preferably, barium oxide) or a material which can absorb oxygen may be provided to expose the filler material 4007 thereto or to the substance that can absorb oxygen. The deterioration of the light emitting element 4011 can be suppressed by providing the hygroscopic material or the material which can absorb oxygen.

EMBODIMENT 8

Since a light-emitting device using a light-emitting element emits light by itself, it exhibits higher visibility in a bright place as compared to a liquid crystal display device. Further, the light-emitting device has a wider viewing angle. Accordingly, the light-emitting device can be applied to a display area in various electronic devices.

Electronic devices using such a light-emitting device of the present invention include a video camera, a digital camera, a goggle display (head mounted display), a navigation system, a sound reproduction device (a car audio equipment and an audio set), a notebook personal computer, a game machine, a PDA (a Portable Digital Assistant, e.g. a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. In particular, in the case of the PDA, it is preferable to use a light-emitting device, since the PDA which is often viewed from a an angle and is required to have a wide viewing angle. FIGS. 26A to 26E respectively show various specific examples of such electronic devices.

Figure 26A:
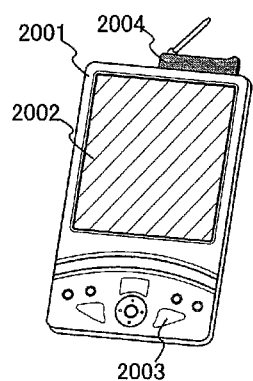
FIGS. 26A to 26E are figures showing electronic devices each using a light emitting device of the invention.

FIG. 26A shows a PDA including a main body 2001, a display area 2002, an operation key 2003, and a modem 2004. The modem 2004 of the PDA shown in FIG. 26A is detachable; however, a modem may be included in the main body 2001. A light emitting device of the invention can be applied to the display area 2002.

Figure 26B:
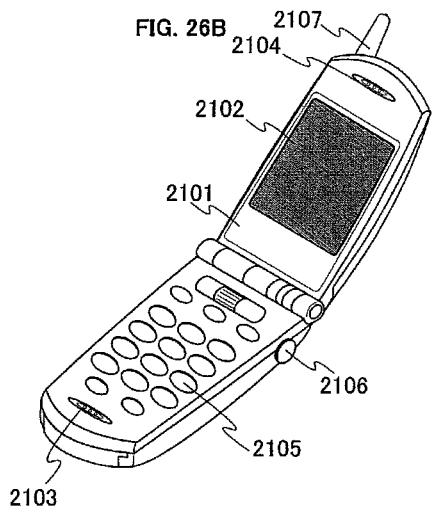

FIG. 26B shows a cellular phone including a main body 2101, a display area 2102, an audio input part 2103, an audio output part 2104, an operation key 2105, an external connection port 2106, and an antenna 2107. The current consumption of the cellular phone can be reduced by displaying white letters on black background in the display area 2102. A light emitting device of the invention can be applied to the display area 2102.

Figure 26C:
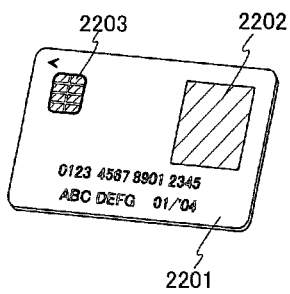

FIG. 26C shows an electronic card including a main body 2201, a display area 2202, and a connection terminal 2203. A light emitting device of the invention can be applied to the display area 2202. A contact electronic card is shown in FIG. 26C; however, a light emitting device of the invention can be applied to a contactless electronic card, or to an electronic card which has functions of both contact type and contactless type.

Figure 26D:
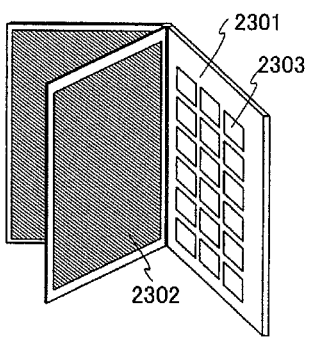

FIG. 26D shows an electronic book including a main body 2301, a display area 2302, and an operation key 2303. Further, a modem may be included in the main body 2301. A light emitting device of the invention can be applied to the display area 2302.

Figure 26E:
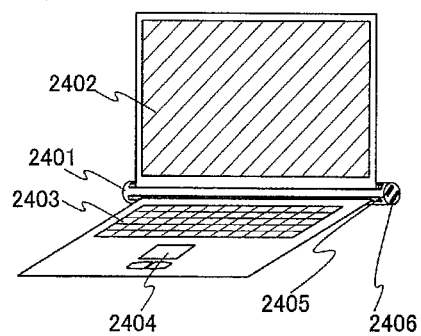

FIG. 26E shows a sheet personal computer including a main body 2401, a display area 2402, a keyboard 2403, a touch pad 2404, an external connections port 2405, and a power plug 2406. A light emitting device of the invention can be applied to the display area 2402.

As described above, the application range of the invention is extremely wide, and the invention can be applied to an electronic device in all fields. Further, an electronic device described in this embodiment may use a light emitting device having a structure shown in any one of Embodiments 1 through 7.

What is claimed is:

1. A method for fabricating a light emitting device, comprising:
    forming a wiring and an auxiliary electrode over a first insulating film;
    forming a first electrode over the first insulating film so as to be in contact with the wiring;
    forming a second insulating film over the first insulating film so as to cover the first electrode, the wiring, and the auxiliary electrode;
    forming a first opening for exposing the first electrode and a second opening for exposing the auxiliary electrode in the second insulating film;
    forming an electroluminescent layer over the second insulating film so as to cover the first opening and the second opening; and
    forming a second electrode so as to be in contact with the electroluminescent layer,
    wherein the electroluminescent layer is in contact with the first electrode in the first opening, and
    wherein the electroluminescent layer is in contact with a top surface of the auxiliary electrode and the second electrode is in contact with a side surface of the auxiliary electrode in the second opening.

2. The method for fabricating a light emitting device according to claim 1, wherein the first insulating film is formed from a photosensitive organic resin.

3. The method for fabricating a light emitting device according to claim 2, wherein the photosensitive organic resin includes a cresol resin.

4. The method for fabricating a light emitting device according to claim 1, wherein the electroluminescent layer is formed by vapor deposition.

5. A method for fabricating a light emitting device, comprising:
    forming a first insulating film over a substrate;
    forming an auxiliary electrode and a wiring over the first insulating film;
    forming a first electrode over the auxiliary electrode and the wiring;
    forming a second insulating film over the first insulating film so as to cover the first electrode, the wiring, and the auxiliary electrode;
    forming a first opening for exposing the first electrode and a second opening for exposing the auxiliary electrode in the second insulating film;
    forming an electroluminescent layer over the second insulating film so as to cover the first opening and the second opening; and
    forming a second electrode so as to be in contact with the electroluminescent layer,
    wherein the electroluminescent layer is in contact with the first electrode in the first opening,
    wherein the electroluminescent layer is in contact with a top surface of the auxiliary electrode and the second electrode is in contact with a side surface of the auxiliary electrode in the second opening, and
    wherein the electroluminescent layer is formed in and around the first opening.

6. The method for fabricating a light emitting device according to claim 5, wherein the first insulating film is formed from a photosensitive organic resin.

7. The method for fabricating a light emitting device according to claim 6, wherein the photosensitive organic resin includes a cresol resin.

8. The method for fabricating a light emitting device according to claim 5, wherein the electroluminescent layer is formed by vapor deposition.

9. A method for fabricating a light emitting device, comprising:
    forming a wiring and an auxiliary electrode over a first insulating film;
    forming a first electrode over the first insulating film so as to be in contact with the wiring;
    forming a second insulating film over the first insulating film so as to cover the first electrode, the wiring, and the auxiliary electrode;
    forming a first opening for exposing the first electrode and a second opening for exposing the auxiliary electrode in the second insulating film;
    forming an electroluminescent layer over the second insulating film so as to cover the first opening; and
    forming a second electrode so as to be in contact with the electroluminescent layer and to cover the second opening,
    wherein the electroluminescent layer is in contact with the first electrode in the first opening,
    wherein the auxiliary electrode and the second electrode are in contact with each other in the second opening, and
    wherein the electroluminescent layer is in contact with a top surface of the auxiliary electrode and the second electrode is in contact with a side surface of the auxiliary electrode in the second opening.

10. The method for fabricating a light emitting device according to claim 9, wherein the first insulating film is formed from a photosensitive organic resin.

11. The method for fabricating a light emitting device according to claim 10, wherein the photosensitive organic resin includes a cresol resin.

12. The method for fabricating a light emitting device according to claim 9, wherein the electroluminescent layer is formed by vapor deposition.

13. A method for fabricating a light emitting device, comprising:

forming a first insulating film over a substrate;

forming an auxiliary electrode and a wiring over the first insulating film;

forming a first electrode over the wiring;

forming a second insulating film over the first insulating film so as to cover the first electrode, the wiring, and the auxiliary electrode;

forming a first opening for exposing the first electrode and a second opening for exposing the auxiliary electrode in the second insulating film;

forming an electroluminescent layer over the second insulating film so as to cover the first opening and the second opening; and forming a second electrode so as to be in contact with the electroluminescent layer, wherein the electroluminescent layer is in contact with the first electrode in the first opening, wherein the auxiliary electrode and the second electrode are in contact with each other in the second opening, and wherein the electroluminescent layer is in contact with a top surface of the auxiliary electrode and the second electrode is in contact with a side surface of the auxiliary electrode in the second opening.

14. The method for fabricating a light emitting device according to claim 13, wherein the first insulating film is formed from a photosensitive organic resin.

15. The method for fabricating a light emitting device according to claim 14, wherein the photosensitive organic resin includes a cresol resin.

16. The method for fabricating a light emitting device according to claim 13, wherein the electroluminescent layer is formed by vapor deposition.

* * * * *

UNITED STATES PATENT AND TRADEMARK OFFICE
CERTIFICATE OF CORRECTION

PATENT NO. : 8,609,181 B2  
APPLICATION NO. : 12/507820  
DATED : December 17, 2013  
INVENTOR(S) : Shunpei Yamazaki, Ritsuko Nagao and Yasuo Nakamura Page 1 of 1

It is certified that error appears in the above-identified patent and that said Letters Patent is hereby corrected as shown below:

In the Specifications

Column 1, line 40, after "hereinafter" insert --.--;

Column 3, line 19, after "layer" insert --.--;

Column 5, line 3, replace "indention" with --invention--;

Column 5, line 39, replace "pattering" with --patterning--;

Column 14, line 19, replace "Alliteratively" with --Alternatively--;

Column 15, line 61, after "top layer" insert --.--;

Column 22, line 30, replace "MgAa" with --MgAg--;

Column 23, line 28, replace "electeoluminescent" with --electroluminescent--;

Column 24, lines 47-48, after "a light emitting layer" insert --.--;

In the Claims

Column 28, line 1, in claim 5 after "over" delete "the auxiliary electrode and".

Signed and Sealed this  
Thirteenth Day of May, 2014

Michelle K. Lee  
*Deputy Director of the United States Patent and Trademark Office*